(12) United States Patent
Gunnam

(10) Patent No.: US 8,621,289 B2
(45) Date of Patent: Dec. 31, 2013

(54) LOCAL AND GLOBAL INTERLEAVING/DE-INTERLEAVING ON VALUES IN AN INFORMATION WORD

(75) Inventor: Kiran Gunnam, San Jose, CA (US)

(73) Assignee: LSI Corporation, San Jose, CA (US)

( * ) Notice: Subject to any disclaimer, the term of this patent is extended or adjusted under 35 U.S.C. 154(b) by 513 days.

(21) Appl. No.: 12/835,989

(22) Filed: Jul. 14, 2010

(65) Prior Publication Data

US 2012/0017132 A1  Jan. 19, 2012

(51) Int. Cl.
*G06F 11/00* (2006.01)
*H03M 13/00* (2006.01)

(52) U.S. Cl.
USPC .............................. 714/701; 714/752; 714/804

(58) Field of Classification Search
None
See application file for complete search history.

(56) References Cited

U.S. PATENT DOCUMENTS

| | | | |
|---|---|---|---|
| 3,647,977 A | 3/1972 | Closs | |
| 5,287,491 A | 2/1994 | Hsu | |
| 5,757,795 A | 5/1998 | Schnell | |
| 5,768,270 A | 6/1998 | Ha-Duong | |
| 6,157,643 A | 12/2000 | Ma | |
| 6,335,930 B1 | 1/2002 | Lee | |
| 6,456,838 B1 | 9/2002 | Wang et al. | |
| 7,013,361 B2 | 3/2006 | Liron | |
| 7,181,676 B2 | 2/2007 | Hocevar | |
| 7,881,568 B2 | 2/2011 | Lin | |
| 7,911,364 B1 | 3/2011 | Zhang et al. | |
| 8,065,598 B1 | 11/2011 | Gunnam et al. | |
| 8,099,561 B2 | 1/2012 | Bayer et al. | |
| 8,161,345 B2 | 4/2012 | Graef | |
| 8,170,129 B2 | 5/2012 | Chang et al. | |
| 8,265,070 B2 | 9/2012 | Khanduri | |
| 8,279,867 B2 | 10/2012 | Carley | |
| 2001/0007608 A1 | 7/2001 | Sugita et al. | |
| 2002/0108030 A1 | 8/2002 | Lee et al. | |

(Continued)

FOREIGN PATENT DOCUMENTS

WO   WO 2010/019168 A1   2/2010

OTHER PUBLICATIONS

Al-Qerem, Ahmad H., "Congestion Control by Using a Buffered Omega Network," IADIS International Conference on Applied Computing 2005, pp. 429-434.

(Continued)

*Primary Examiner* — Daniel McMahon
(74) *Attorney, Agent, or Firm* — Mendelsohn, Drucker & Dunleavy, P.C.; Craig M. Brown; Steve Mendelsohn

(57) ABSTRACT

In one embodiment, a de-interleaver receives soft-output values corresponding to bits of an LDPC-encoded codeword. The de-interleaver has scratch pad memory that provides sets of the soft-output values to a local de-interleaver. The number of values in each set equals the number of columns in a block column of the LDPC H-matrix. Each set has at least two subsets of soft-output values corresponding to at least two different block columns of the LDPC H-matrix, where the individual soft-output values of the at least two subsets are interleaved with one another. Local de-interleaving is performed on each set such that the soft-output values of each subset are grouped together. Global de-interleaving is then performed on the subsets such that the subsets corresponding to the same block columns of the H-matrix are arranged together. In another embodiment, an interleaver performs global then local interleaving to perform the inverse of the de-interleaver processing.

20 Claims, 12 Drawing Sheets

(56) References Cited

U.S. PATENT DOCUMENTS

| | | |
|---|---|---|
| 2002/0174434 A1 | 11/2002 | Lee et al. |
| 2003/0112797 A1 | 6/2003 | Li et al. |
| 2005/0015234 A1 | 1/2005 | Bhattacharya et al. |
| 2005/0193320 A1 | 9/2005 | Varnica et al. |
| 2005/0204255 A1 | 9/2005 | Yeh et al. |
| 2005/0283707 A1 | 12/2005 | Sharon et al. |
| 2006/0107181 A1 | 5/2006 | Dave et al. |
| 2006/0179401 A1 | 8/2006 | Nefedov |
| 2006/0282712 A1 | 12/2006 | Argon et al. |
| 2006/0285852 A1 | 12/2006 | Xi et al. |
| 2007/0011569 A1 | 1/2007 | Vila Casado et al. |
| 2007/0011573 A1 | 1/2007 | Farjadrad et al. |
| 2007/0011586 A1 | 1/2007 | Belogolovyi et al. |
| 2007/0044006 A1 | 2/2007 | Yang et al. |
| 2007/0071009 A1 | 3/2007 | Nagaraj et al. |
| 2007/0124652 A1 | 5/2007 | Litsyn et al. |
| 2007/0147481 A1 | 6/2007 | Bottomley et al. |
| 2007/0162788 A1 | 7/2007 | Moelker |
| 2007/0208988 A1 | 9/2007 | Aman et al. |
| 2007/0234178 A1 | 10/2007 | Richardson et al. |
| 2007/0234184 A1 | 10/2007 | Richardson |
| 2008/0028272 A1 | 1/2008 | Richardson |
| 2008/0056202 A1 | 3/2008 | Kim et al. |
| 2008/0082868 A1 | 4/2008 | Tran et al. |
| 2008/0104485 A1 | 5/2008 | Lyakh et al. |
| 2008/0107103 A1 | 5/2008 | Yang et al. |
| 2008/0109701 A1 | 5/2008 | Yu et al. |
| 2008/0126910 A1 | 5/2008 | Venkatesan et al. |
| 2008/0148129 A1 | 6/2008 | Moon |
| 2008/0163032 A1 | 7/2008 | Lastras-Montano |
| 2008/0235561 A1 | 9/2008 | Yang |
| 2008/0276156 A1 | 11/2008 | Gunnam et al. |
| 2008/0301521 A1 | 12/2008 | Gunnam et al. |
| 2008/0301536 A1 | 12/2008 | Shin et al. |
| 2008/0320353 A1 | 12/2008 | Blankenship et al. |
| 2009/0024909 A1 | 1/2009 | Shen et al. |
| 2009/0077447 A1 | 3/2009 | Buckley et al. |
| 2009/0083606 A1 | 3/2009 | Choi et al. |
| 2009/0180535 A1 | 7/2009 | Bretl et al. |
| 2009/0224801 A1 | 9/2009 | Lewin |
| 2009/0273492 A1 | 11/2009 | Yang et al. |
| 2010/0042806 A1 | 2/2010 | Gunnam |
| 2010/0042890 A1 | 2/2010 | Gunnam |
| 2010/0111014 A1 | 5/2010 | Kang et al. |
| 2010/0118800 A1 | 5/2010 | Kim et al. |
| 2010/0169738 A1 | 7/2010 | Wu et al. |
| 2010/0189162 A1 | 7/2010 | Yoshimoto et al. |
| 2010/0214857 A1* | 8/2010 | Hsu et al. ............... 365/191 |
| 2011/0093762 A1 | 4/2011 | Kwon et al. |
| 2012/0079340 A1* | 3/2012 | Gunnam et al. ........... 714/752 |
| 2012/0176856 A1* | 7/2012 | Hsu et al. ............. 365/230.03 |

OTHER PUBLICATIONS

Mahajan, Rita and Vig, Dr. Renu, "Performance and Reliability Analysis of New Fault-Tolerant Advance Omega Network," WSEAS Transactions on Computers, Issue 8, vol. 7, Aug. 2008, pp. 1280-1290.

Aljundi, Ahmad Chadi et al., "A Study of an Evaluation Methodology for Unbuffered Multistage Interconnection Networks," Proceedings of 17th International Parallel and Distributed Processing Symposium, IPDPS '03, pp. 1-8.

K. Gunnam, et al., *Technical Note on Iterative LDPC Solutions for Turbo Equalization*, Texas A&M Technical Note, Jul. 2006 (5 pages) (available online at http://dropzone.tamu.edu).

Kiran Gunnam, Gwan Choi, Mark Yeary—"An LDPC decoding schedule for memory access reduction", IEEE International Conference on Acoustics, Speech, and Signal Processing (ICASSP) 2004, pp. 173-176, vol. 15.

Stefan Landner, Olgica Milenkovic—"Algorithmic and Combinatorial Analysis of Trapping Sets in Structured LDPC Codes", International Conference on Wireless Networks, Communications and Mobile Computing, 2005, pp. 630-635, vol. 1.

Hao Zhong,Tong Zhang—"Block—LDPC: A Practical LDPC Coding System Design Approach", IEEE transactions on circuits and systems—I: Regular Papers, Apr. 2005, pp. 766-775, vol. 52.

Kiran K. Gunnam, Gwan S. Choi, Weihuang Wang, Euncheol Kim, and Mark B. Yeary—"Decoding of Quasi-cyclic LDPC Codes Using an On-the-Fly Computation", Fortieth Asilomar Conference on Signals, Systems and Computers (ACSSC), 2006, pp. 1192-1199.

Thomas J. Richardson and Rudiger L. Urbanke—"Efficient Encoding of Low-Density Parity-Check Codes", IEEE Transactions on Information Theory, Feb. 2001,pp. 638-656,vol. 47, No. 2.

Tom Richardson—"Error Floors of LDPC Codes", IEEE Transactions on Information Theory, Feb. 2001, pp. 1426-1435,vol. 47, No. 2.

E. Papagiannis, C. Tjhai, M. Ahmed, M. Ambroze, M. Tomlinson—"Improved Iterative Decoding for Perpendicular Magnetic Recording", The ISCTA 2005 Conference on Feb. 4, 2005, pp. 1-4.

Kiran K. Gunnam, Gwan S. Choi, and Mark B. Yeary—"A Parallel VLSI Architecture for Layered Decoding for Array LDPC Codes", 20th International Conference on VLSI Design, 2007,6th International Conference on Embedded Systems, Jan. 2007 pp. 738-743.

David J.C. MacKay—"Information Theory, Inference, and Learning Algorithms", Cambridge University Press Sep. 2003, p. 640.

R. Michael Tanner, Deepak Sridhara, Arvind Sridharan, Thomas E. Fuja, and Daniel J. Costello, Jr—"LDPC Block and Convolutional Codes Based on Circulant Matrices", IEEE Transactions on Information Theory, Dec. 2004, pp. 2966-2984, vol.50, No. 12.

Amin Shokrollahi—"LDPC Codes: An Introduction, In Coding, Cryptography and Combinatorics",Computer Science and Applied Logic, Birkhauser, Basel, 2004, pp. 85-110, vol. 23.

Yang Han and William E. Ryan—"LDPC Decoder Strategies for Achieving Low Error Floors", Proceedings of Information Theory and Applications Workshop, San Diego, CA, Jan. 2008, pp. 1-10.

Mohammad M. Mansour and Naresh R. Shanbhag—"Low Power VLSI decoder architectures for LDPC codes" International Symposium on Low Power Electronics and Design Proceedings of the 2002, ICIMS Research Center, 2002, pp. 284-289.

Dale E. Hocevar—"A Reduced Complexity Decoder Architecture Via Layered Decoding of LDPC Codes", IEEE Workshop on Signal Processing Systems, 2004, pp. 107-112.

Robert G. Gallager—"Low Density Parity—Check Codes",Cambridge Mass Jul. 1963,pp. 90.

T. Richardson and R. Urbanke—"Modern Coding Theory", Cambridge University Press, Preliminary version—Oct. 18, 2007, p. 590.

Kiran Gunnam, Gwan Choi, Weihuang Wang, Mark Yeary—"Multi-Rate Layered Decoder Architecture for Block LDPC Codes of the IEEE 802, 11n Wireless Standard", IEEE International Symposium on Circuits and Systems (ISCAS) 2007, pp. 1645-1648.

Kiran K. Gunnam, Gwan S. Choi, Mark B. Yeary, Shaohua Yang and Yuanxing Lee—"Next Generation Iterative LDPC Solutions for Magnetic Recording Storage", 42nd Asilomar Conference on Signals, Systems and Computers, 2008, pp. 1148-1152.

D.J.C. MacKay and R.M. Neal—"Near Shannon limit performance of low density parity check codes", Electronics Letters Mar. 13, 1997, pp. 458-459, vol. 33 No. 6.

Jinghu Chen, Ajay Dholakia, Evangelos Eleftheriou, Marc P. C. Fossorier, Xiao-Yu Hu, "Reduced-Complexity Decoding of LDPC Codes", IEEE Transactions on Communications, Aug. 2005, pp. 1288-1299,vol. 53, No. 8.

Kiran K. Gunnam, Gwan S. Choi, Mark B. Yeary and Mohammed Atiquzzaman—"VLSI Architectures for Layered Decoding for Irregular LDPC Codes of WiMax", IEEE International Conference on Communications (ICC), 2007, pp. 4542-4547.

Andrew J. Blanksby and Chris J. Howland—"A 690-mW 1-Gb/s 1024-b, Rate-1/2 Low-Density Parity-Check Code Decoder", IEEE Journal of Solid-State Circuits, Mar. 2002.pp. 404-412,vol. 37, No. 3.

Kiran Gunnam, Weihuang Wang, Gwan Choi, Mark Yeary—"VLSI Architectures for Turbo Decoding Message Passing Using Min-Sum for Rate-Compatible Array LDPC Codes", 2nd International Symposium on Wireless Pervasive Computing (ISWPC), 2007, pp. 561-566.

(56) References Cited

OTHER PUBLICATIONS

Kiran K. Gunnam, Gwan S. Choi, Weihuang Wang, and Mark B. Yeary—"A Parallel VLSI Architecture for Layered Decoding",Proceedings of the 20th International Conference on VLSI Design, 6th International Conference: Embedded Systems, 2007, pp. 738-743.
R.Michael Tanner—"A Recursive Approach to Low Complexity Codes",IEEE transaction on Information Theory, Sep. 1981,pp. 533-547,vol. IT-27, No. 5.
Mohammad M. Mansour, and Naresh R. Shanbhag—"A 640-Mb/s 2048-Bit Programmable LDPC Decoder Chip", IEEE Journal of Solid-State Circuits, Mar. 2006, pp. 684-698,vol. 41, No. 3.
Badri N. Vellambi R, and Faramarz Fekri, "An Improved Decoding Algorithm for Low-Density Parity-Check Codes over the Binary Erasure Channel", IEEE GLOBECOM 2005 proceedings, pp. 1182-1186.
Yang Han, William E. Ryan—"Low-Floor Decoders for LDPC Codes", IEEE Transactions on Communications, vol. 57, No. 6, Jun. 2009, pp. 1663-1673.
PCT International Search Report dated Feb. 9, 2009 from International Application No. PCT/US 08/86537.
PCT International Search Report dated May 15, 2009 from International Application No. PCT/US 09/39279.
PCT International Search Report dated Feb. 12, 2009 from International Application No. PCT/US 08/86523.
PCT International Search Report dated May 28, 2009 from International Application No. PCT/US 09/41215.
PCT International Search Report dated May 15, 2009 from International Application No. PCT/US 09/39918.
Vila Casado, Andres I., Weng, Wen-Yen and Wesel, Richard D. "Multiple Rate Low-Density Parity-Check Codes with Constant Blocklength," IEEE 2004, pp. 2010-2014.
Vila Casado, Andres I. "Variable-rate Low-denisty Parity-check Codes with Constant Blocklength," UCLA Technologies Available for Licensing Copyright © 2009 The Regents of the University of California. http://www.research.ucla.edu/tech/ucla05-074.htm (2 pages).
Vila Casado, Andres I., Weng, Wen-Yen, Valle, Stefano and Wesel, Richard D. "Multiple-Rate Low-Density Parity-Check Codes with Constant Blocklength," IEEE Transactions on Communications, vol. 57, No. 1, Jan. 2009; pp. 75-83.
Richardson, Tom, "Error Floors of LDPC Codes," Allerton Conf. on Communication, Control and Computing, (Monticello, Illinois), Oct. 2003, pp. 1426-1435.
Cole, Chad A. and Hall, Eric K., "Analysis and Design of Moderate Length Regular LDPC Codes with Low Error Floors," Proc, 40th Conf. Information Sciences and Systems, Princeton, NJ, 2006, 6 pgs.
Cavus et al., "A Performance Improvement and Error Floor Avoidance Technique for Belief Propagation Decoding of LDPC Codes," IEEE 16th International Symposium, Personal, Indoor & Mobile Radio Communications (PIMRC), Berlin, Germany Sep. 11-14, 2005, pp. 2386-2390.
Cavus, Enver et al., "An IS Simulation Technique for Very Low BER Performance Evaluation of LDPC Codes," IEEE International Conference on Communications, Jun. 1, 2006, pp. 1095-1100.
Gunnam, Kiran K., Choi, Gwan S., and Yeary, Mark B., "Technical Note on Iterative LDPC Solutions for Turbo Equalization," Texas A&M Technical Note, Department of ECE, Texas A&M University, College Station, TX 77843, Jul. 2006 (available online at http://dropzone.tamu.edu), pp. 1-5.
K. Gunnam et al., "Value-Reuse Properties of Min-Sum for GF(q)" (dated Oct. 2006) Dept. of ECE, Texas A&M University Technical Note, published about Aug. 2010.
K. Gunnam et al., "Value-Reuse Properties of Min-Sum for GF (q)" (dated Jul. 2008) Dept. of ECE, Texas A&M University Technical Note, published about Aug. 2010.
K. Gunnam "Area and Energy Efficient VLSI Architectures for Low-Density Parity-Check Decoders Using an On-The-Fly Computation" dissertation at Texas A&M University, Dec. 2006.
Jaros, J., "Evolutionary Optimization of Multistage Interconnection Networks Performance," Jul. 8, 2009; GECCO 09.
Schack, C. et al., A Multiprocessor Architecture with an Omega Network for the Massively Parallel Model GCA, 2009, Springer-Verlag.

\* cited by examiner $$H = \begin{pmatrix} B_{1,1} & B_{1,2} & B_{1,3} & B_{1,4} & B_{1,5} & B_{1,6} & B_{1,7} & B_{1,8} & B_{1,9} & B_{1,10} & B_{1,11} & B_{1,12} \\ B_{2,1} & B_{2,2} & B_{2,3} & B_{2,4} & B_{2,5} & B_{2,6} & B_{2,7} & B_{2,8} & B_{2,9} & B_{2,10} & B_{2,11} & B_{2,12} \\ B_{3,1} & B_{3,2} & B_{3,3} & B_{3,4} & B_{3,5} & B_{3,6} & B_{3,7} & B_{3,8} & B_{3,9} & B_{3,10} & B_{3,11} & B_{3,12} \\ B_{4,1} & B_{4,2} & B_{4,3} & B_{4,4} & B_{4,5} & B_{4,6} & B_{4,7} & B_{4,8} & B_{4,9} & B_{4,10} & B_{4,11} & B_{4,12} \end{pmatrix} \begin{matrix} \} r=4 \end{matrix}$$

| TABLE I: CHANNEL SOFT-OUTPUT VALUE SUBSETS | | | | | | | | | | | | |
|---|---|---|---|---|---|---|---|---|---|---|---|---|
| MEM ROW | 712(1) 1 | 712(2) 1 | 712(3) 1 | 712(4) 1 | 712(5) 1 | 712(6) 1 | 712(7) 1 | 712(8) 1 | ... | 712(9) 4 | 712(10) 4 | 712(11) 4 | 712(12) 4 |
| H-MATRIX BC | BC1 (1) | BC1 (2) | BC1 (3) | BC1 (4) | BC2 (1) | BC2 (2) | BC2 (3) | BC2 (4) | ... | BC12 (1) | BC12 (2) | BC12 (3) | BC12 (4) |
| SOFT-OUTPUT VALUES | $La_1$ | $La_{25}$ | $La_{49}$ | $La_{73}$ | $La_{97}$ | $La_{121}$ | $La_{145}$ | $La_{169}$ | ... | $La_{1057}$ | $La_{1081}$ | $La_{1105}$ | $La_{1129}$ |
| | $La_2$ | $La_{26}$ | $La_{50}$ | $La_{74}$ | $La_{98}$ | $La_{122}$ | $La_{146}$ | $La_{170}$ | ... | $La_{1058}$ | $La_{1082}$ | $La_{1106}$ | $La_{1130}$ |
| | $La_3$ | $La_{27}$ | $La_{51}$ | $La_{75}$ | $La_{99}$ | $La_{123}$ | $La_{147}$ | $La_{171}$ | ... | $La_{1059}$ | $La_{1083}$ | $La_{1107}$ | $La_{1131}$ |
| | ... | ... | ... | ... | ... | ... | ... | ... | ... | ... | ... | ... | ... |
| | $La_{24}$ | $La_{48}$ | $La_{72}$ | $La_{96}$ | $La_{120}$ | $La_{144}$ | $La_{168}$ | $La_{192}$ | ... | $La_{1080}$ | $La_{1104}$ | $La_{1128}$ | $La_{1152}$ |

FIG. 9

LOCAL AND GLOBAL INTERLEAVING/DE-INTERLEAVING ON VALUES IN AN INFORMATION WORD

CROSS-REFERENCE TO RELATED APPLICATIONS

The subject matter of this application is related to:
U.S. patent application Ser. No. 12/113,729 filed May 1, 2008,
U.S. patent application Ser. No. 12/113,755 filed May 1, 2008,
U.S. patent application Ser. No. 12/323,626 filed Nov. 26, 2008,
U.S. patent application Ser. No. 12/401,116 filed Mar. 10, 2009,
U.S. patent application Ser. No. 12/675,981 filed on Mar. 2, 2010,
U.S. patent application Ser. No. 12/677,322 filed Mar. 10, 2010,
U.S. patent application Ser. No. 12/680,810 filed Mar. 30, 2010,
U.S. patent application Ser. No. 12/524,418 filed on Jul. 24, 2009,
U.S. patent application Ser. No. 12/420,535 filed Apr. 8, 2009,
U.S. patent application Ser. No. 12/475,786 filed Jun. 1, 2009,
U.S. patent application Ser. No. 12/260,608 filed on Oct. 29, 2008,
PCT patent application no. PCT/US09/41215 filed on Apr. 21, 2009,
U.S. patent application Ser. No. 12/427,786 filed on Apr. 22, 2009,
U.S. patent application Ser. No. 12/492,328 filed on Jun. 26, 2009,
U.S. patent application Ser. No. 12/492,346 filed on Jun. 26, 2009,
U.S. patent application Ser. No. 12/492,357 filed on Jun. 26, 2009,
U.S. patent application Ser. No. 12/492,374 filed on Jun. 26, 2009,
U.S. patent application Ser. No. 12/538,915 filed on Aug. 11, 2009,
U.S. patent application Ser. No. 12/540,078 filed on Aug. 12, 2009,
U.S. patent application Ser. No. 12/540,035 filed on Aug. 12, 2009,
U.S. patent application Ser. No. 12/540,002 filed on Aug. 12, 2009,
U.S. patent application Ser. No. 12/510,639 filed on Jul. 28, 2009,
U.S. patent application Ser. No. 12/524,418 filed on Jul. 24, 2009,
U.S. patent application Ser. No. 12/510,722 filed on Jul. 28, 2009,
U.S. patent application Ser. No. 12/510,667 filed on Jul. 28, 2009,
U.S. patent application Ser. No. 12/644,622 filed on Dec. 22, 2009,
U.S. patent application Ser. No. 12/644,181 filed on Dec. 22, 2009,
U.S. patent application Ser. No. 12/766,038 filed on Apr. 23, 2010,
U.S. patent application Ser. No. 12/827,652 filed on Jun. 30, 2010, and
U.S. patent application Ser. No. 12/826,026 filed on Jun. 29, 2010,
the teachings of all of which are incorporated herein by reference in their entirety.

BACKGROUND OF THE INVENTION

1. Field of the Invention

The present invention relates to signal processing, and, more specifically but not exclusively, to techniques for interleaving and de-interleaving data.

2. Description of the Related Art

To reduce the effects that burst errors in a transmission channel have on recovering data at a receiver, many data transmission systems employ data interleaving schemes. In a first possible implementation of a system employing both error-correction encoding and interleaving, at the transmitter, un-interleaved data is encoded, and the resulting encoded codeword is interleaved for transmission. At the receiver, the received encoded codeword is de-interleaved and then decoded to recover the original data stream. In this implementation, the data is encoded in an un-interleaved domain, and the codeword is transmitted in an interleaved domain.

In a second possible implementation, the data is encoded in an interleaved domain and transmitted in an un-interleaved domain. In this implementation, at the transmitter, the data is first interleaved, and the resulting interleaved data is encoded to generate an encoded codeword. The resulting parity bits are de-interleaved and multiplexed with the un-interleaved data for transmission. Note that the de-interleaved domain is identical to the original un-interleaved domain. At the receiver, in order to be able to decode the encoded codeword in the interleaved domain, the received encoded codeword is interleaved prior to decoding. After decoding, the resulting decoded data is then de-interleaved to output the recovered data in the original un-interleaved domain.

SUMMARY OF THE INVENTION

In one embodiment, the present invention is an apparatus adapted to perform interleaving on values in an information word to generate an interleaved information word. The apparatus comprises a global interleaver and a local interleaver. The global interleaver is adapted to interleave, on a global unit basis, the values in the information word to generate a plurality of interleaved global units, each global unit having multiple values corresponding to the information word. The local interleaver is adapted to receive a first group of multiple global units from the global interleaver, and interleave, on a local unit basis, lower than the global unit basis, the first group of global units to generate a first set of interleaved values of the interleaved information word. The local interleaver is also adapted to receive a second group of multiple global units from the global interleaver, and interleave, on the local unit basis, the second group of global units to generate a second set of interleaved values of the interleaved information word.

In another embodiment, the invention is a local/global interleaver-implemented method for performing interleaving on values in an information word to generate an interleaved information word, as performed by the apparatus described in the previous paragraph.

In yet another embodiment, the present invention is an apparatus adapted to perform de-interleaving on values in an information word to generate a de-interleaved information word. The apparatus comprises a local de-interleaver and a global de-interleaver. The local de-interleaver is adapted to receive a first set of multiple values corresponding to the information word, and de-interleave, on a local unit basis, the first set of values to generate a first group of two or more global units, each global unit in the first group having multiple values corresponding to the information word. The local de-interleaver is also adapted to receive a second set of multiple values corresponding to the information word, and de-interleave, on the local unit basis, the second set of values to generate a second group of two or more global units, each global unit in the second group having multiple values corresponding to the information word, The global de-interleaver adapted to receive at least the first and second groups of global units from the local de-interleaver, and de-interleave, on a global unit basis, greater than the local unit basis, at least the global units of the first and second groups to generate the de-interleaved information word.

In yet still another embodiment, the present invention is a local/global interleaver-implemented method for performing de-interleaving on values in an information word to generate a de-interleaved information word, as performed by the apparatus described in the previous paragraph.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 2 shows one implementation of a quasi-cyclic (QC) parity-check matrix;

FIG. 9 shows Table I, which illustrates an exemplary arrangement of values stored in the soft-value memories in FIG. 7;

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Figure 1:
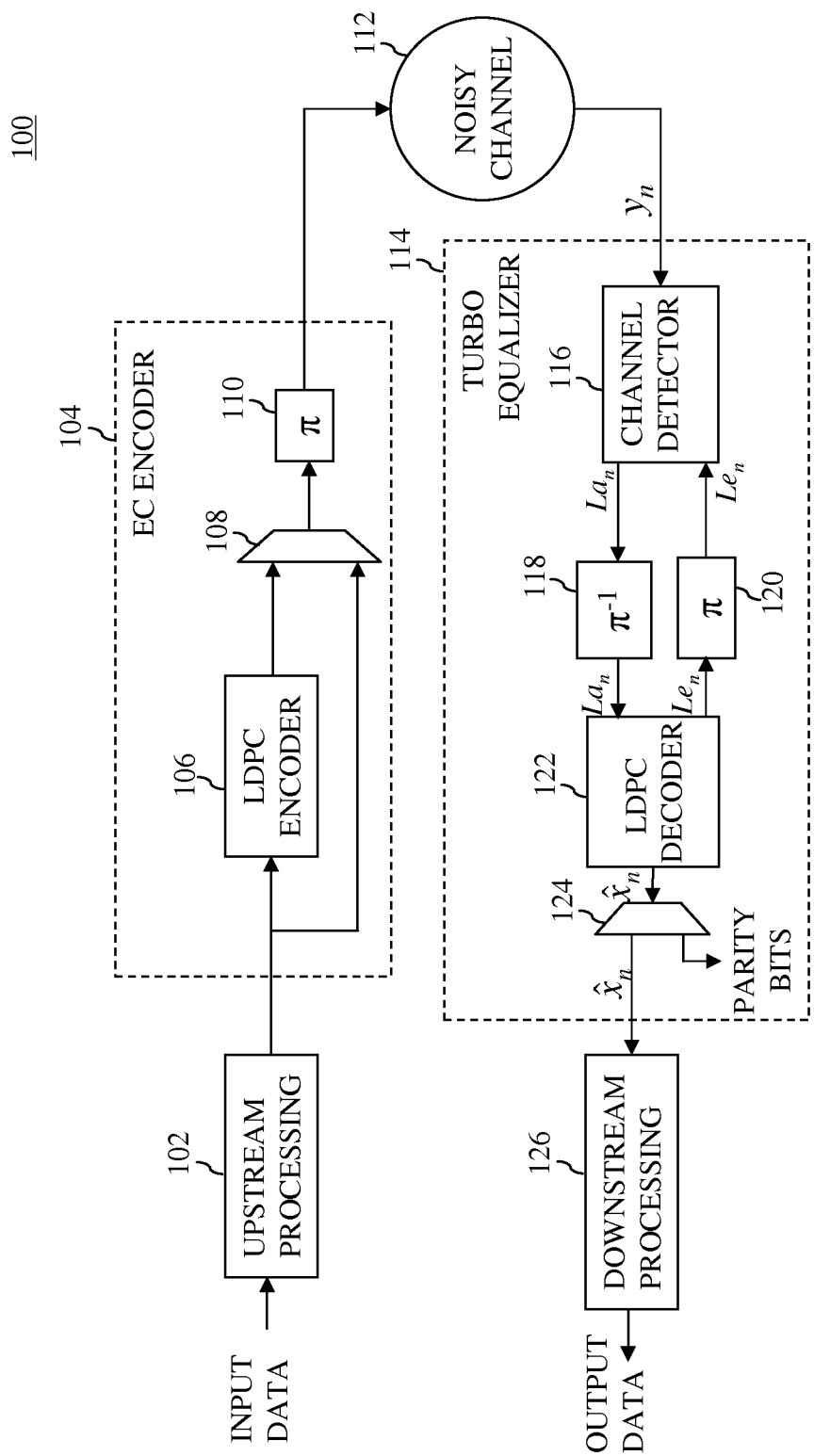
FIG. 1 shows a simplified block diagram of one implementation of a communications system.

FIG. 1 shows a simplified block diagram of one implementation of a communications system 100. Communications system 100 has (i) an upper path, herein referred to as the write path, in which an input data stream is processed and transmitted over noisy channel 112, and (ii) a lower path, herein referred to as the read path, in which data is received from noisy channel 112 and processed to recover the original input data stream that was transmitted by the write path. Communications system 100 may be any communications system suitable for transmitting an input data stream, such as a wireless communications system or a hard-disk drive (HDD) system. When implemented as a wireless communications system, noisy channel 112 is a wireless transmission medium, and, when implemented as an HDD system, noisy channel 112 is a hard-disk platter.

In the write path, upstream processing 102 receives an input data stream from, for example, a user application. Upstream processing 102 implements an error-detection encoding scheme such as cyclic-redundancy-check (CRC) encoding or any other suitable error-detection encoding scheme. Upstream processing 102 may also perform other suitable processing, such as run-length encoding, to prepare the input data stream for transmission over noisy channel 112.

Upstream processing 102 provides the input data stream to error-correction (EC) encoder 104, which prepares the input data stream for transmission over noisy channel 112. EC encoder 104 has low-density parity-check (LDPC) encoder 106, which encodes the input data stream using LDPC encoding to generate an LDPC-encoded codeword. The parity bits of the LDPC-encoded codeword are provided to the upper input of multiplexer 108, and the original input data stream is provided to the lower input of multiplexer 108. Multiplexer 108 outputs the input user data stream, and, in so doing, inserts the parity bits within the input user data stream. For example, multiplexer 108 may insert one nibble of parity-bits for every eight nibbles of user data bits, where a nibble is a group of four bits.

Error-correction encoder 104, along with turbo equalizer 114 (discussed below), implements an interleaving scheme to reduce the effects that burst errors have on recovering the input data stream when the input data stream is transmitted over noisy channel 112. In particular, error-correction encoder 104 implements an example of the first possible interleaving scheme described above, in which the data is encoded in an un-interleaved domain, the resulting codeword is interleaved by interleaver 110, and the interleaved codeword is transmitted over noisy channel 112. After interleaving, but prior to transmission, the LDPC-encoded codeword may be processed using further processing (not shown), such as digital-to-analog conversion, pre-amplification, and possibly other suitable processing to prepare the LDPC-encoded codeword for transmission over noisy channel 112.

In the read path, turbo equalizer 114 receives codewords transmitted over noisy channel 112. The codewords may be processed using processing (not shown), such as amplification, analog-to-digital conversion, finite-impulse-response (FIR) filtering, equalization, and possibly other processing suitable for preparing codewords for decoding. Samples $y_n$ of the retrieved codewords are provided to turbo equalizer 114, which has at least one channel detector 116 and at least one LDPC decoder 122. Turbo equalizer 114 may be implemented in many different ways, and the details of turbo equalizer 114 are provided merely to illustrate the basic components of an exemplary turbo equalizer.

For each LDPC-encoded codeword processed, a set of samples $y_n$ is provided to channel detector 116, where each sample $y_n$ corresponds to a bit of the LDPC-encoded codeword. Channel detector 116 implements a suitable channel detection technique, such as Viterbi soft-output detection or maximum a posteriori (MAP) detection, to generate a channel soft-output value $La_n^{(O)}$ (e.g., a log-likelihood ratio (LLR)) corresponding to each bit n of the error-correction-encoded codeword. As used herein, the term "soft-output value" refers to a value comprising a hard-decision bit (i.e., the most-significant bit) and at least one confidence value bit (i.e., the least-significant bits).

Channel detector 116 provides the channel soft-output values $La_n^{(O)}$ to de-interleaver 118, which performs de-interleaving on the channel soft-output values $La_n^{(O)}$ using a de-interleaving mapping $\pi^{-1}$ that is the inverse of the interleaving mapping $\pi$ used by interleaver 110. Thus, the sequence of soft-output values $La_n^{(O)}$ output from de-interleaver 118 corresponds to the sequence of codeword bits input to interleaver 110.

De-interleaver 118 outputs the de-interleaved channel soft-output values $La_n^{(O)}$ to LDPC decoder 122, which implements LDPC decoding to recover the correct LDPC-encoded codeword. In so doing, LDPC decoder 122 generates a set of updated soft-output values $P_n$, where each value $P_n$ corresponds to the $n^{th}$ bit of the LDPC-encoded codeword and each value $P_n$ comprises a hard-decision bit $\hat{x}_n$ and a confidence value. The hard-decision bits $x_n$ corresponding to user data, herein referred to as user-data hard-decision bits $x_n$, are de-multiplexed from the hard-decision bits $x_n$ corresponding to parity bits, herein referred to as parity hard-decision bits $x_n$, using de-multiplexer 124. The user-data hard-decision bits $x_n$ are provided to downstream processing 126, which may perform, for example, a cyclic-redundancy check (CRC) to determine whether the codeword recovered is the correct codeword (i.e., the codeword that was generated by the write path). The parity hard-decision bits $x_n$ may be used for debugging or other purposes, but are not typically provided downstream along with the user-data hard-decision bits $x_n$.

In addition to outputting hard-decision bits $x_n$, LDPC encoder 122 may output extrinsic soft-output value $Le_n$ for each bit n of the LDPC-encoded codeword as shown in Equation (1) below:

$$Le_n = P_n - La_n^{(O)}. \quad (1)$$

The extrinsic soft-output values $Le_n$ are interleaved by interleaver 120, which uses an interleaving mapping $\pi$ that is the inverse of the de-interleaving mapping $\pi_u^{-1}$ used by de-interleaver 118. The interleaved extrinsic soft-output values $Le_n$ are provided to channel detector 116, which uses the extrinsic soft-output values $Le_n$ to improve detection. For example, in Viterbi detection, the extrinsic soft-output values $Le_n$ are used to improve the branch-metric calculation.

Note that, for ease of discussion, this specification uses the terms "interleaver," "interleaving," "de-interleaver," and "de-interleaving" relative to the order of bits of the LDPC-encoded codeword. For example, component 118 of system 100 is referred to as a "de-interleaver" because component 118 (i) receives channel soft-output values $La_n^{(O)}$ from channel detector 116 in an order that does not correspond to the order of bits in the un-interleaved LDPC-encoded codeword output by multiplexer 108, and (ii) outputs channel soft-output values $La_n^{(O)}$ in an order, herein referred to as the "codeword order," that corresponds to the order of bits in the un-interleaved LDPC-encoded codeword output by multiplexer 108.

However, component 118 may also be considered to be an "interleaver" relative to the order in which bits are transmitted over noisy channel 112. For example, component 118 may be referred to as an "interleaver" because component 118 (i) receives channel soft-output values $La_n^{(O)}$ from channel detector 116 in an order that corresponds to the order in which the bits were transmitted over noisy channel 112, herein referred to as the "channel order," and (ii) outputs channel soft-output values $La_n^{(O)}$ in an order other than the channel order (i.e., the decoder order). Analogous to component 118, components 110 and 120 may also be referred to as "interleavers" or "de-interleavers."

Further, it is important to note that interleavers 110 and 120 and de-interleaver 118 could be implemented in systems other than LDPC-encoded system 100, including systems that do not employ LDPC encoding/decoding. In such systems, the use of the terms "interleaver," "interleaving," "de-interleaver," and "de-interleaving" might not be used relative to the order of bits of an LDPC-encoded codeword. Rather, they might be used relative to some other order in which the values are received and/or output.

Thus, although the terms "interleaver" and "interleaving" are used to refer to certain components in this specification, it will be understood that the terms "de-interleaver" and "de-interleaving" may also be used interchangeably to refer to those components. Similarly, although the terms "de-interleaver" and "de-interleaving" are used to refer to certain other components in this specification, it will be understood that the terms "interleaver" and "interleaving" may also be used interchangeably to refer to those other components.

In light of the previous explanation, as used in the claims, unless made explicitly clear in the claim, the terms "interleaver" and "de-interleaver" are interchangeable, and the terms "interleaving" and "de-interleaving" are interchangeable. For example, a system having a transmitter with an interleaver and a receiver with a corresponding de-interleaver, could be equivalently referred to as a system having a transmitter with a de-interleaver and a receiver with a corresponding interleaver.

The design of de-interleaver 118 and interleaver 120 should take into account the processing performed by LDPC decoder 122 and channel detector 116. For example, de-interleaver 118 should be capable of receiving channel soft-output values $La_n^{(O)}$ at the rate at which the channel soft-output values $La_n^{(O)}$ are output from channel detector 116. De-interleaver 118 should also be capable of outputting channel soft-output values $La_n^{(O)}$ at the rate, and the particular order, in which LDPC decoder 122 needs to receive the channel soft-output values $La_n^{(O)}$. The rate and order may depend in part on the parity-check matrix implemented by LDPC decoder 122. As an example, consider the parity-check matrix of FIG. 2.

FIG. 2 shows one implementation of a quasi-cyclic (QC) parity-check matrix 200. Parity-check matrix 200, commonly referred to as an H-matrix, comprises 48 circulants $B_{j,k}$ that are arranged in (i) r=4 rows of circulants, herein referred to as block rows, where j=1, ..., r and (ii) c=12 columns of circulants, herein referred to as block columns, where k=1, ..., c. A circulant is a sub-matrix that is either an identity matrix or is obtained by cyclically shifting an identity matrix, and a quasi-cyclic LDPC code is an LDPC code in which all of the sub-matrices are circulants. In H-matrix 200, each circulant $B_{j,k}$ is a p×p sub-matrix that may be obtained by cyclically shifting a single p×p identity matrix. For purposes of this discussion, assume that p=96 such that H-matrix 200 has p×r=96×4=384 total rows and p×c=96×12=1,152 total columns.

Since each circulant $B_{j,k}$ is a permutation of an identity matrix, the hamming weight (i.e., the number of entries having a value of one) of each column in a circulant and the hamming weight of each row in a circulant are both equal to 1. Thus, the total hamming weight $w_r$ for each row of H-matrix 200 is equal to 1×c=1×12=12, and the total hamming weight $w_c$ for each column of H-matrix 200 is equal to 1×r=1×4=4. Each of the 384 individual rows of H-matrix 200 corresponds to an $m^{th}$ check node, where m ranges from 1, ..., 384, and each of the 1,152 columns corresponds to an $n^{th}$ variable node (also referred to as a bit node), where n ranges from 1, ..., 1,152. Further, each check node is connected to $w_r$=12 variable nodes row (i.e., the check-node degree=12) as indicated by the 1s in a row, and each variable node is connected to $w_c$=4 check nodes (i.e., the variable-node degree=4) as indicated by the 1s in a column. H-matrix 200 may be described as a regular LDPC code since all rows of H-matrix 200 have the same hamming weight $w_r$ and all columns of H-matrix 200 have the same hamming weight $w_c$.

Each individual column of H-matrix 200 corresponds to one bit of the LDPC-encoded codeword, and thus, an LDPC encoded codeword based on H-matrix 200 has N=1,152 total bits. The p (e.g., 96) individual columns in each block column of H-matrix 200 may correspond to (i) all data bits, (ii) all parity bits, or (iii) a combination of data and parity bits. For this discussion, suppose that the number K of bits corresponding to data is equal to 768 (i.e., 8 block columns×96 individual columns per block column=768) and the number (N−K) of bits corresponding to parity is equal to 384 (i.e., 1,125−768=384). Further, suppose that all of the individual columns in block columns 1-4 correspond to only parity bits, while all of the individual columns in block columns 5-12 correspond to only data bits.

Typically, LDPC decoders are designed to receive all of the channel soft-output values $La_n^{(0)}$ corresponding to one or more full block columns of the corresponding H-matrix at a time, and initiate the updates of the one or more full block columns as soon as they are received. The channel soft-output values $La_n^{(0)}$ may be received and processed in numerical order (e.g., from block column 1 to block column 12) or may be received and processed in another order, depending on the order in which the LDPC decoder is designed to process the channel soft-output values $La_n^{(0)}$. For ease of discussion, numerical order is used in all examples in this specification. Thus, for this discussion, assume that LDPC decoder 122 receives 96 channel soft-output values $La_n^{(0)}$ per clock cycle, and receives the soft-output values $La_n^{(0)}$ in order from block column 1 to block column 12. However, it will be understood that, in other embodiments, the values may be arranged in an order other than numerical order.

Figure 3:
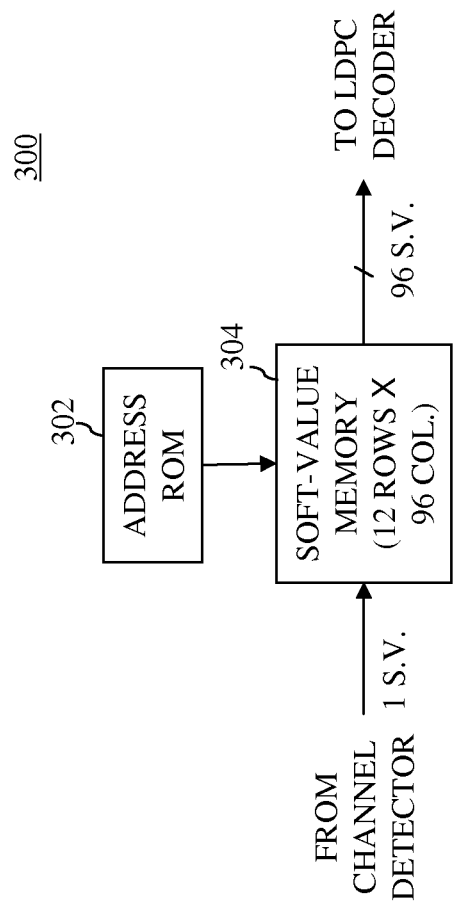
FIG. 3 shows a simplified block diagram of one implementation of a de-interleaver that may be used to implement the de-interleaver in FIG. 1.

FIG. 3 shows a simplified block diagram of one implementation of a de-interleaver 300 that may be used to implement de-interleaver 118 in FIG. 1. De-interleaver 300 has soft-value memory 304 and address ROM 302. Soft-value memory 304 has 1,152 addresses, one corresponding to each individual column of H-matrix 200. The 1,152 addresses are arranged in c rows (i.e., 12), one for each block column of H-matrix 200, where each row stores p channel soft-output values $La_n^{(0)}$ (i.e., 96) corresponding to one block column of H-matrix 200. Soft-value memory 304 also has one input port and one output port. The input port provides access for write operations to only one row of soft-value memory 304 at a time (i.e., all 96 addresses). Similarly, the output port provides access for read operations to only on row of soft-value memory 304 at a time (i.e., all 96 addresses).

During writing operations, the 1,152 channel soft-output values $La_n^{(0)}$ are provided to soft-value memory 304 at the rate of one channel soft-output value $La_n^{(0)}$ per clock cycle from, for example, channel detector 116. In addition, for each channel soft-output value $La_n^{(0)}$ received, address ROM 302 provides an address identifier to soft-value memory 304, which identifies the address of soft-value memory 304 to which the channel soft-output value $La_n^{(0)}$ is written. The address identifier may include the row and column to which the channel soft-output value $La_n^{(0)}$ is written. The channel soft-output value $La_n^{(0)}$ is then written via the input port to the received address, and the remaining 95 addresses are refreshed (i.e., rewritten with their previously stored values). Writing is complete after 1,152 clock cycles.

During reading operations, the 1,152 channel soft-output values $La_n^{(0)}$ are output from soft-value memory 304 to, for example, LDPC decoder 122. In particular, soft-value memory 304 outputs the 1,152 channel soft-output values $La_n^{(0)}$ one row (i.e., all 96 values) at a time. The particular row output is determined by address ROM 302, which provides the row identifier to soft-value memory 304. Reading is complete after 1,152/96=12 clock cycles. Thus, the total time needed to perform an interleaving operation is 1,164 total clock cycles (i.e., 1,152+12=1,164). To further understand the operation of de-interleaver 300, consider FIG. 4.

Figure 4:
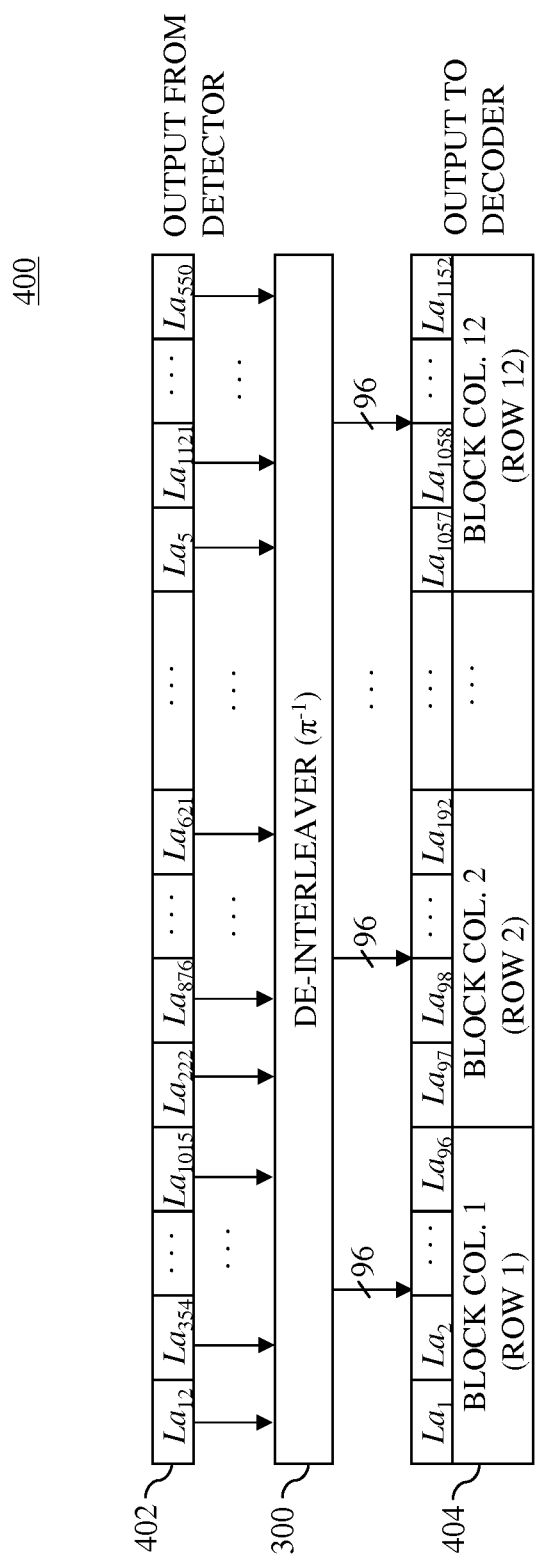
FIG. 4 shows a data flow diagram for an exemplary de-interleaving operation performed by the de-interleaver of FIG. 3.

FIG. 4 shows a data flow diagram 400 for an exemplary de-interleaving operation performed by de-interleaver 300. In data flow diagram 400, upper row 402 corresponds to the channel soft-output values $La_n^{(0)}$ received from the detector. The channel soft-output values $La_n^{(0)}$ are received from left to right by de-interleaver 300 at a rate of one channel soft-output values $La_n^{(0)}$ per clock cycle. In this example, the channel soft-output value $La_n^{(0)}$ corresponding to the 12th bit of the LDPC-encoded codeword (i.e., $La_{12}^{(0)}$) is received first by de-interleaver 300, and the channel soft-output value $La_n^{(0)}$ corresponding to the 550th bit of the LDPC-encoded codeword (i.e., $La_{550}^{(0)}$) is received last. The order in which the channel soft-output values $La_n^{(0)}$ are received may vary based on the particular interleaving mapping π employed by the interleaver at the encoder (e.g., 110). Note that the particular order shown in FIG. 4 is merely exemplary.

Upon receiving a channel soft-output value $La_n^{(0)}$, the channel soft-output value $La_n^{(0)}$ is stored in the appropriate address of soft-value memory 304. For example, channel soft-output values $La_1^{(0)}$ to $La_{96}^{(0)}$ corresponding to block column 1 are stored in order in row 1 of soft-value memory 304, channel soft-output values $La_{97}^{(0)}$ to $La_{192}^{(0)}$ corresponding to block column 2 are stored in order in row 2 of soft-value memory 304, and so on. After all 1,152 channel soft-output values $La_n^{(0)}$ have been received, the channel soft-output values $La_n^{(0)}$ are output as represented in bottom row 404 from de-interleaver 300 to the decoder. The rows of soft-value memory 304 are output in numerical order by de-interleaver 300 at a rate of one row (i.e., all 96 channel soft-output values $La_n^{(0)}$) per clock cycle. Thus, row 1 of soft-value memory 304 is output, followed by row 2, followed by row 3, and so on.

To speed up processing of the 1,152 channel soft-output values $La_n^{(0)}$, de-interleaver 300 could be implemented to receive a plurality of channel soft-output values $La_n^{(0)}$ per clock cycle. The plurality of channel soft-output values $La_n^{(0)}$ may correspond to different block columns of H-matrix 200, and as a result, the plurality of channel soft-output values $La_n^{(0)}$ may need to be stored in different addresses of soft-value memory 304. Since the input port of interleaver 300 writes to only one row of soft-value memory 304 at a time, more than one input port could be used to accommodate receipt of a plurality of soft-output values $La_n^{(0)}$ per clock cycle. However, increasing the number of ports increases both the complexity and the size of interleaver 300.

Figure 5:
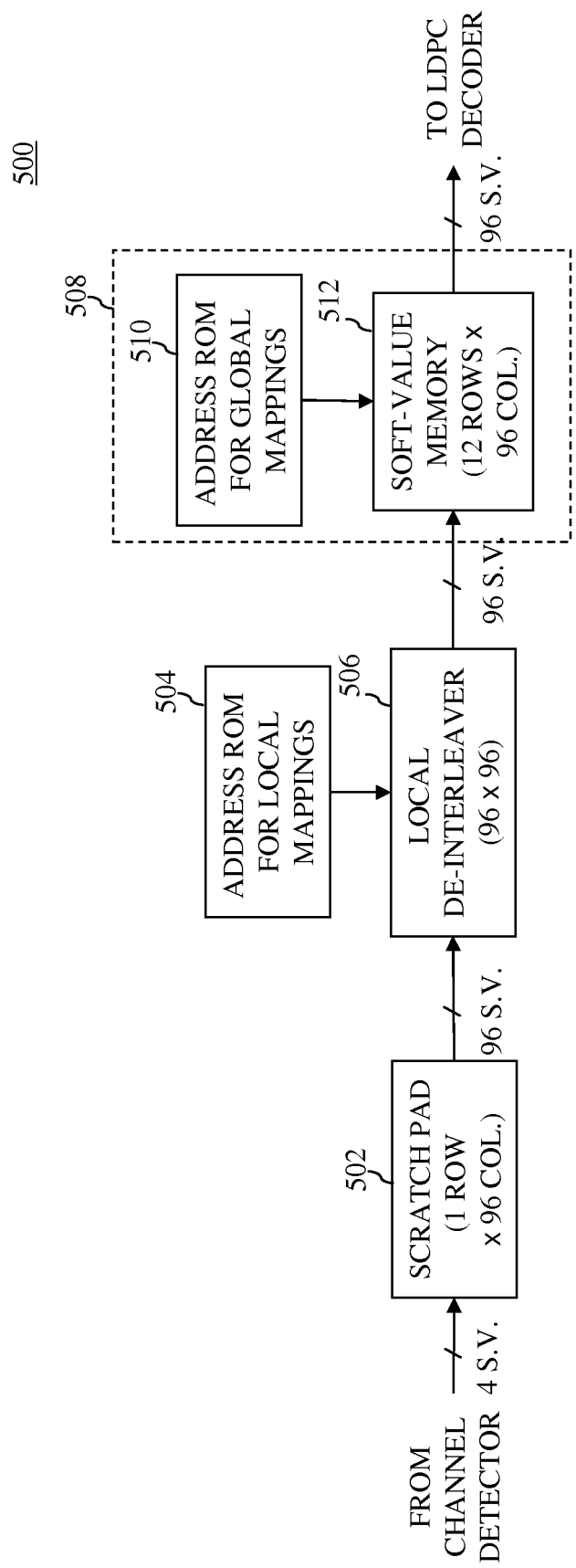
FIG. 5 shows a simplified block diagram of another implementation of a de-interleaver that may be used to implement the de-interleaver in FIG. 1.

FIG. 5 shows a simplified block diagram of another implementation of a de-interleaver 500 that may be used to implement de-interleaver 118 in FIG. 1. A brief description of a de-interleaver that operates in a manner similar to de-interleaver 300 may be found in K. Gunnam, et al., *Technical Note on Iterative LDPC Solutions for Turbo Equalization*, Texas A&M Technical Note, July 2006 (available online at http://dropzone.tamu.edu), the teachings of which are incorporated herein by reference in their entirety. De-interleaver 500 has scratch pad memory 502, which has one row for storing p (e.g., 96) channel soft-output values $La_n^{(0)}$ (i.e., one soft-output value $La_n^{(0)}$ for each individual column of a block column of H-matrix 200). Scratch pad 502 receives four soft-output values $La_n^{(0)}$ per clock cycle from, for example, channel detector 106, and accumulates 96 channel soft-output values $La_n^{(0)}$ over 24 clock cycles (i.e., 96 total samples/4 samples per clock cycle=24 clock cycles). The 96 channel soft-output values $La_n^{(0)}$ correspond to only one block column of H-matrix 200. After 96 channel soft-output values $La_n^{(0)}$ have been accumulated, they are output in parallel in one clock cycle to local de-interleaver 506, and scratch pad 502 begins receiving soft-output values corresponding to another block column. Note that the sets of 96 channel soft-output values $La_n^{(0)}$ need not be received in order from block column 1 to block column 12. The total time to process all 1,152 channel soft-output values $La_n^{(0)}$ is equal to 288 clock cycles (i.e., 24 clock cycles per block column to write×12 block columns=288 clock cycles).

Local de-interleaver 506 is a p×p (e.g., 96×96) de-interleaver that may be implemented using any suitable de-interleaver, such as a cyclic-shift de-interleaver, a convolutional de-interleaver, or a de-interleaver that performs more-random de-interleaving than cyclic-shift de-interleavers and convolutional de-interleavers. For each set of 96 channel soft-output values $La_n^{(0)}$ received, local de-interleaver 506 receives a local de-interleaving mapping instruction $\pi_{Lc}^{-1}$ from address ROM 504. The local mapping instruction $\pi_{Lc}^{-1}$ may be, and preferably is, different from one set of 96 channel soft-output values $La_n^{(0)}$ to the next (i.e., local mapping instructions $\pi_{Lc}^{-1}$ range from $\pi_{L1}^{-1}$ to $\pi_{L12}^{-1}$). For example, suppose that local de-interleaver 506 is implemented as a cyclic-shift de-interleaver. For a first set of 96 channel soft-output values $La_n^{(0)}$, address ROM 504 may provide a cyclic shift factor of 36 to local de-interleaver 506 such that local de-interleaver 506 cyclically shifts the first set of 96 channel soft-output values $La_n^{(0)}$ by a factor of 36. For a second set of 96 channel soft-output values $La_n^{(0)}$, address ROM 504 may provide a cyclic shift factor of 88 to local de-interleaver 506 such that local de-interleaver 506 cyclically shifts the second set of 96 channel soft-output values $La_n^{(0)}$ by a factor of 88.

After the 96 channel soft-output values $La_n^{(0)}$ in each set is de-interleaved by local de-interleaver 506, the 96 channel soft-output values $La_n^{(0)}$ are provided in parallel to global de-interleaver 508. Global interleaver 508 comprises soft-value memory 512 and address ROM 510, which together, implement a global de-interleaving mapping $\pi_G^{-1}$ to de-interleave the sets of channel soft-output values $La_n^{(0)}$ from one another. This is in contrast to local de-interleaver 506 and de-interleaver 300 of FIG. 3, which de-interleave individual channel soft-output values $La_n^{(0)}$ from one another. Similar to soft-value memory 304 of FIG. 3, soft-value memory 512 has 1,152 addresses, one corresponding to each individual column of H-matrix 200, that are arranged in c rows (e.g., 12), where each row stores p channel soft-output values $La_n^{(0)}$ (e.g., 96) corresponding to one block column of H-matrix 200. Soft-value memory 512 also has one input port and one output port. The input port provides access for write operations to only one row of soft-value memory 512 at a time (i.e., all 96 addresses). Similarly, the output port provides access for read operations to only one row of soft-value memory 512 at a time (i.e., all 96 addresses).

For each set of 96 channel soft-output values $La_n^{(0)}$, address ROM 510 provides an address identifier to soft-value memory 512, which identifies the row of soft-value memory 512 to which the 96 channel soft-output values $La_n^{(0)}$ is written. The 96 channel soft-output values $La_n^{(0)}$ are then written via the input port to the row corresponding to the address identifier. Writing to soft-value memory 512 requires twelve clock cycles, one for each of the twelve rows of soft-value memory 512. Note that, as each of the first to eleventh sets of 96 channel soft-output values $La_n^{(0)}$ are written to soft-value memory 512, a subsequent set (i.e., second to twelfth sets, respectively) is accumulated by scratch pad 502. Thus, writing the first to eleventh sets of 96 channel soft-output values $La_n^{(0)}$ to soft-value memory 512 does not require any clock cycles in addition to the 288 clock cycles needed by scratch pad 502. Writing the twelfth set of 96 channel soft-output values $La_n^{(0)}$ and the processing of local de-interleaver 506 may, however, require an additional clock cycle or two. Thus, a total of 288 clock cycles (plus possibly a few clock cycles) are needed from the time that all 1,152 channel soft-output values $La_n^{(0)}$ are received from the detector to the time that they are written to soft-value memory 512.

After all 1,152 channel soft-output values $La_n^{(0)}$ are stored in soft-value memory 512, they are output to, for example, LDPC decoder 122. In this case, soft-value memory 512 may be treated as internal memory of LDPC decoder 122, and the order in which the rows are accessed may be determined by the LDPC decoder scheduler. LDPC decoder 122 accesses soft-value memory 512 one row (i.e., 96 values) per clock cycle. The particular row output is determined by an address supplied by LDPC decoder 122, which provides the row identifier to soft-value memory 512. To further understand the operation of local/global de-interleaver 500, consider FIG. 6.

Figure 6:
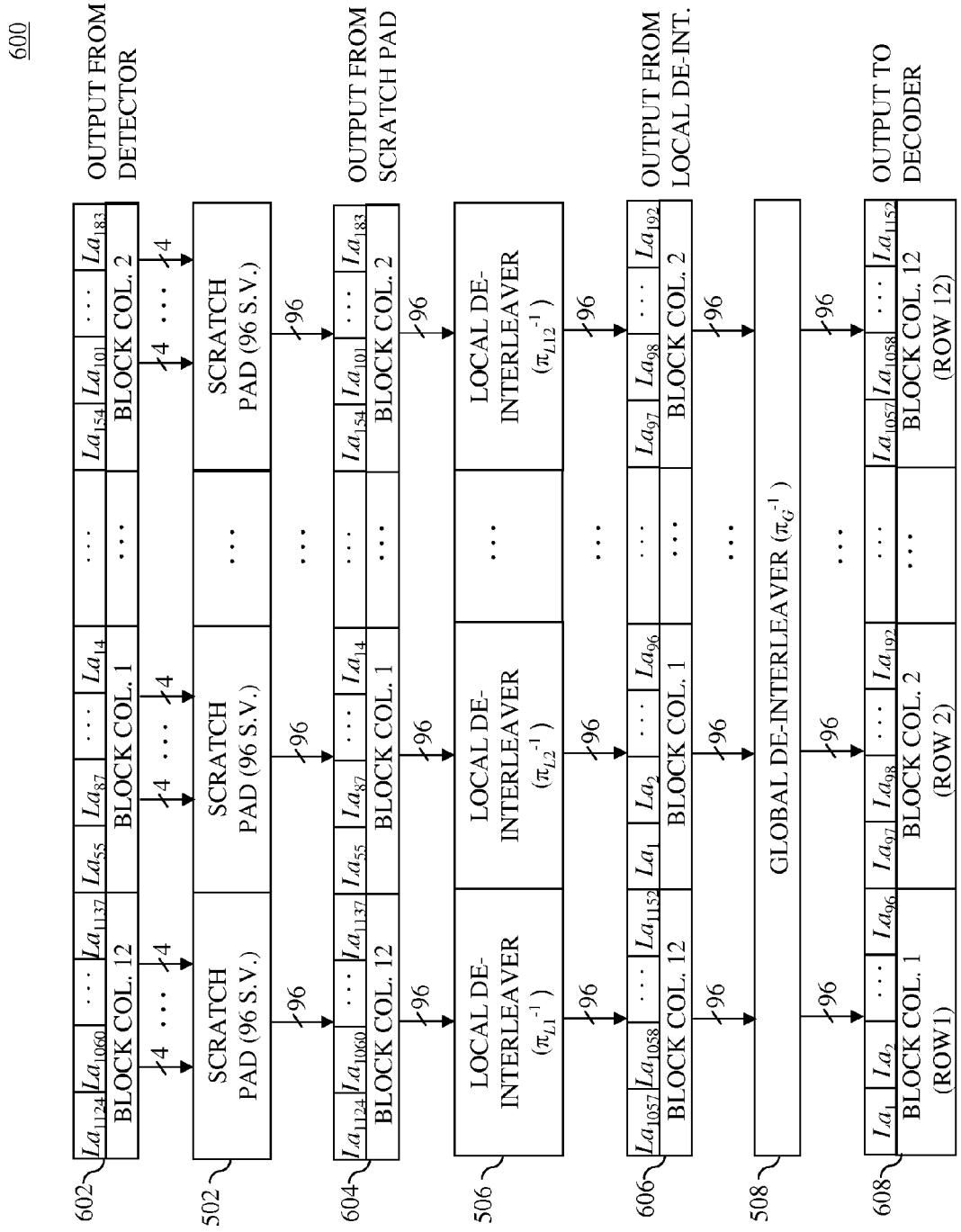
FIG. 6 shows a data flow diagram for an exemplary de-interleaving operation performed by the de-interleaver in FIG. 5.

FIG. 6 shows a data flow diagram 600 for an exemplary de-interleaving operation performed by de-interleaver 500. In data flow diagram 600, upper row 602 corresponds to the channel soft-output values $La_n^{(0)}$ received from the detector. The channel soft-output values $La_n^{(0)}$ are received from left to right by de-interleaver 500 at a rate of four channel soft-output values $La_n^{(0)}$ per clock cycle. Scratch pad 502 accumulates 96 channel soft-output values $La_n^{(0)}$ every 24 clock cycles. Each set of 96 channel soft-output values $La_n^{(0)}$ corresponds to one block column. In this example, the channel soft-output values $La_n^{(0)}$ corresponding to the twelfth and first block columns are received first and second, respectively, and the channel soft-output values $La_n^{(0)}$ corresponding to the second block column are received last. The order in which the sets of channel soft-output values $La_n^{(0)}$ are received may vary depending on the particular global interleaving mapping $\pi_G$ employed by the interleaver at the encoder (e.g., 110).

The first set of 96 channel soft-output values $La_n^{(0)}$ received by scratch pad 502 includes channel soft-output values $La_{1057}^{(0)}$ to $La_{1152}^{(0)}$, which correspond to the twelfth block column of H-matrix 200 (i.e., the 1,057 to 1,152 individual columns of H-matrix 200). In this example, for the first set of 96 channel soft-output values $La_n^{(0)}$ received, channel soft-output values $La_{1124}^{(0)}$ and $La_{1060}^{(0)}$ are received first and second, respectively, and channel soft-output value $La_{1137}^{(0)}$ is received last. The order in which the channel soft-output values $La_n^{(0)}$ in a set are received may also vary based on the particular local interleaving mapping $\pi_{Lc}$ employed by the interleaver at the encoder (e.g., 110).

After accumulating a set of 96 channel soft-output values $La_n^{(0)}$, scratch pad 502 outputs the 96 channel soft-output values $La_n^{(0)}$ as shown in row 604 in parallel to local de-interleaver 506. Local de-interleaver 506 performs local de-interleaving to re-arrange the 96 channel soft-output values $La_n^{(0)}$ in each set in order. For example, for the channel soft-output values $La_n^{(0)}$ corresponding to the twelfth block column, local de-interleaver 506 employs local de-interleaving mapping $\pi_{L1}^{-1}$ to arrange the channel soft-output values $La_n^{(0)}$ in order from channel soft-output value $La_{1057}^{(0)}$ to channel soft-output value $La_{1152}^{(0)}$.

After re-arranging each set of 96 channel soft-output values $La_n^{(0)}$, the set is output as shown in row 606 to global de-interleaver 508. Upon receiving a set of 96 channel soft-output values $La_n^{(0)}$, the set is stored in the appropriate address of soft-value memory 512 of global de-interleaver 508. Thus, in this example, the set of channel soft-output values $La_n^{(0)}$ corresponding to the first block column is stored in the first row of soft-value memory 512, the second set of channel soft-output values $La_n^{(0)}$ corresponding to the second block column is stored in the second row of soft-value memory 512, and so on. After all 1,152 channel soft-output values $La_n^{(0)}$ have been received, the channel soft-output values $La_n^{(0)}$ are output, as represented in bottom row 608, from global de-interleaver 508 to the decoder. The rows of soft-value memory 512 (i.e., all 96 channel soft-output values $La_n^{(0)}$) are output in numerical order at a rate per clock cycle. Thus, row 1 of soft-value memory 512 is output, followed by row 2, followed by row 3, and so on.

De-interleaver 500 may be referred to as a local/global de-interleaver. A local/global de-interleaver is a de-interleaver that performs both local de-interleaving on a local unit basis and global de-interleaving on a global unit basis, where (i) the unit basis refers to the number of values treated as a fixed unit for de-interleaving purposes and (ii) the global unit basis is larger than the local unit basis.

For example, in FIG. 5, local de-interleaver 506 performs de-interleaving on each set of 96 interleaved channel soft-output values $La_n^{(0)}$, where the local unit basis (i.e., the number of values treated as a fixed local unit for local de-interleaving) is one value. Thus, local de-interleaver 506 de-interleaves 96 local units (i.e., 96 interleaved channel soft-output values $La_n^{(0)}$) at the level of the individual value (i.e., value by value) to generate a set of 96 de-interleaved values.

Global de-interleaver 508 performs de-interleaving on twelve sets of 96 de-interleaved values generated by local de-interleaver 506, where the global unit basis (i.e., the number of values treated as a fixed global unit for global de-interleaving) is 96 values. Thus, global de-interleaver 508 de-interleaves twelve global units (i.e., the 12 sets) at the level of the global unit (i.e., global unit by global unit) to generate twelve de-interleaved global units, where each global unit is itself a set of 96 de-interleaved values generated by local de-interleaver 506.

Global de-interleaver 508 performs one example of global de-interleaving, where the global unit basis is equal to the local set size (i.e., the size of the set of values operated on by the local de-interleaver). In other words, for every set of 96 values that are de-interleaved by local de-interleaver 506, there is a single corresponding global unit of 96 de-interleaved values that is de-interleaved by global de-interleaver 508 with other similar global units of 96 de-interleaved values also generated by local de-interleaver 506. As described later in the context of the embodiments of FIGS. 7 and 10, in other types of global de-interleaving, the global unit basis is different from the local set size.

Analogous to a local/global de-interleaver, a local/global interleaver performs both local interleaving on a local unit basis and global interleaving on a global unit basis, where the global unit basis is larger than the local unit basis.

Compared to de-interleaver 300, de-interleaver 500 is capable of performing a de-interleaving in a fewer number of clock cycles. Further, de-interleaver 500 is less complex than a de-interleaver comparable to de-interleaver 300 that processes more than one channel soft-output value $La_n^{(0)}$ per clock cycle (i.e., that has more than one input port). However, the processing performed by de-interleaver 500 is somewhat limited because the 96 channel soft-output values $La_n^{(0)}$ corresponding to each block column of H-matrix 200 are processed together as a set, and therefore the 96 channel soft-output values $La_n^{(0)}$ in a set cannot be spread out amongst the other sets.

Figure 7:
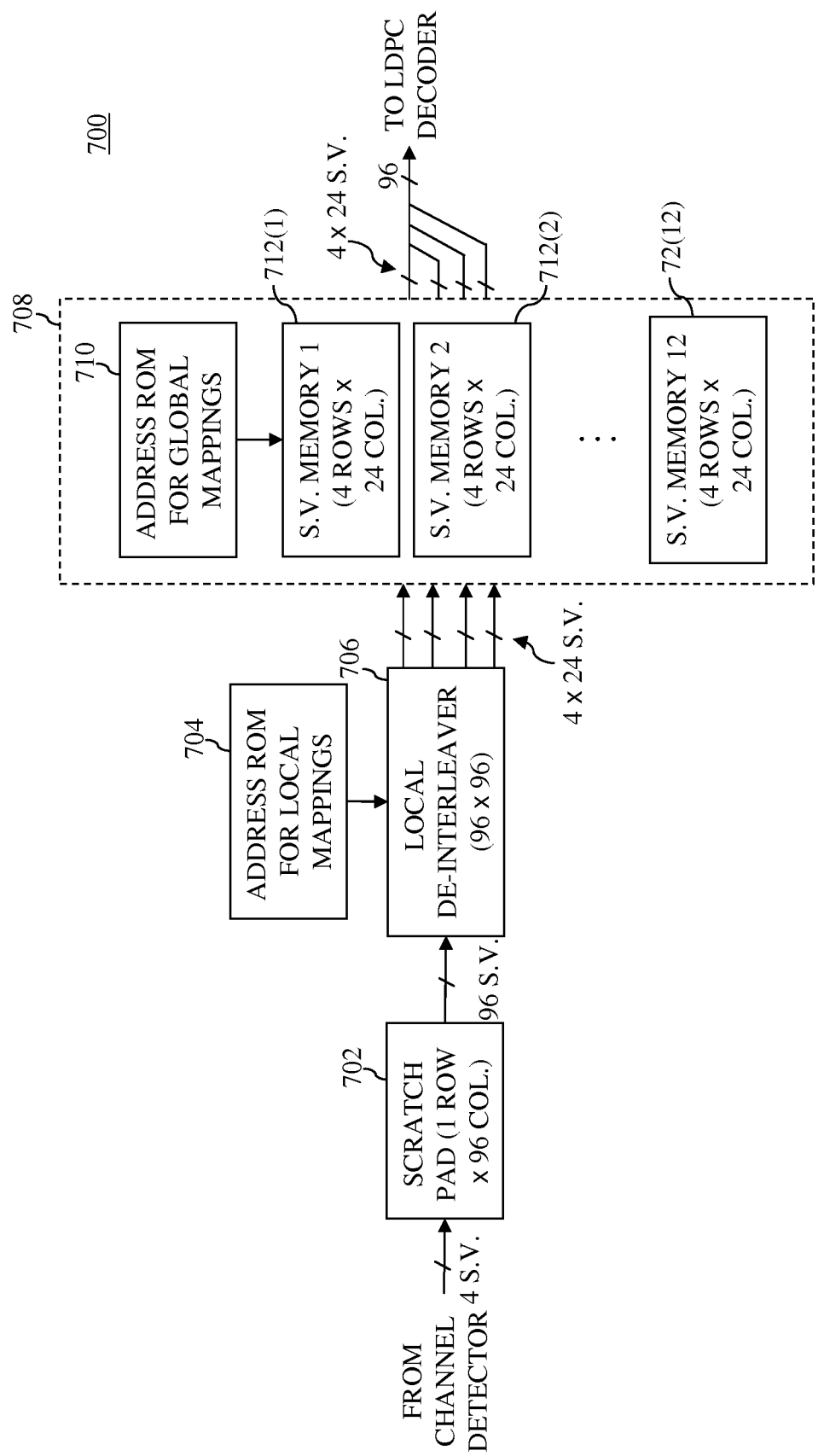
FIG. 7 shows a simplified block diagram of a de-interleaver according to one embodiment of the present invention that may be used to implement the de-interleaver in FIG. 1.

FIG. 7 shows a simplified block diagram of a local/global de-interleaver 700 according to one embodiment of the present invention that may be used to implement de-interleaver 118 in FIG. 1. De-interleaver 700 has scratch pad memory 702, which operates in a manner similar to that of scratch pad memory 502 of FIG. 5. Note, however, as discussed in further detail below, the channel soft-output values $La_n^{(0)}$ in each set of 96 channel soft-output values $La_n^{(0)}$ processed by scratch pad memory 702 correspond to as many as $l=4$ different block columns of H-matrix 200, where $l$ is the number of input ports for global de-interleaver 708. This is in contrast to the channel soft-output values $La_n^{(0)}$ processed by scratch pad memory 502, which correspond to only one block column of H-matrix 200.

Local de-interleaver 706 receives the sets of 96 channel soft-output values $La_n^{(0)}$ from scratch pad memory 702 and performs de-interleaving in a manner similar to that of local de-interleaver 506 of FIG. 5 (i.e., using mapping instructions received from address ROM 704). One important distinction, however, is that local de-interleaver 706, in de-interleaving each set of 96 channel soft-output values $La_n^{(0)}$, re-arranges the channel soft-output values $La_n^{(0)}$ into four subsets of 24 channel soft-output values $La_n^{(0)}$. Each subset of 24 channel soft-output values $La_n^{(0)}$ corresponds to 24 individual columns of one block column of H-matrix 200. The four subsets generated from each set of 96 channel soft-output values $La_n^{(0)}$ correspond to as many as $l=4$, different block columns of H-matrix 200. Similar to local de-interleaver 506, the particular mappings implemented by local de-interleaver 706 preferably vary from one set to the next (i.e., local mapping instructions $\pi_{Lc}^{-1}$ range from $\pi_{L1}^{-1}$ to $\pi_{L12}^{-1}$). After the 96 channel soft-output values $La_n^{(0)}$ in each set are de-interleaved by local de-interleaver 706, the 96 channel soft-output values $La_n^{(0)}$ are provided to global de-interleaver 708.

Global interleaver 708 comprises twelve soft-value memories 712(1)-(12) and address ROM 710, which together implement a global de-interleaving mapping $\pi_G^{-1}$ to de-interleave the subsets of channel soft-output values $La_n^{(0)}$ from one another. This is in contrast to (i) local de-interleaver 506 and de-interleaver 300 of FIG. 3, which de-interleave individual channel soft-output values $La_n^{(0)}$ from one another, and (ii) de-interleaver 508, which de-interleaves sets of 96 channel soft-output values $La_n^{(0)}$ from one another. Each soft-value memory 712 has 96 total addresses that are arranged into four rows, where each row stores 24 channel soft-output values $La_n^{(0)}$. Global de-interleaver 708 also has four input ports and four output ports. Each input port provides access for write operations to one row of soft-value memories 712

(1)-(12) at a time (i.e., all 24 addresses), and the four input ports provide access to four different soft-value memories 712 at a time. Thus, the four input ports provide access to 96 total addresses (i.e., 4×24=96) of soft-value memories 712 (1)-(12), which is the same number of addresses accessed by the input ports of soft-value memory 304 of FIG. 3 and soft-value memory 512 of FIG. 5. Similarly, the four output ports provide access for read operations to four rows of four different soft-value memories 712 at a time (i.e., 96 addresses total addresses).

For each subset of 24 channel soft-output values $La_n^{(0)}$, address ROM 710 provides an address identifier to soft-value memories 712(1)-(12), which identifies the row of soft-value memories 712(1)-(12) to which the 24 channel soft-output values $La_n^{(0)}$ are written. The 24 channel soft-output values $La_n^{(0)}$ are then written via one of the four input ports to the row corresponding to the address identifier. Writing to soft-value memories 712(1)-(12) requires twelve clock cycles, where four rows of soft-value memories 712(1)-(12) are written per clock cycle. Similar to de-interleaver 500, a total of approximately 288 clock cycles (plus possibly a few clock cycles) are needed from the time that all 1,152 channel soft-output values $La_n^{(0)}$ are received from the detector to the time that they are written to soft-value memories 712(1)-(12).

After all 1,152 channel soft-output values $La_n^{(0)}$ are stored in soft-value memories 712(1)-(12), they are output to, for example, LDPC decoder 122. In this case, soft-value memories 712(1)-(12) may be treated as internal memory of LDPC decoder 122, and the order in which the rows are accessed may be determined by the LDPC decoder scheduler. LDPC decoder 122 accesses soft-value memory 512 four rows (i.e., 96 values) per clock cycle, where each set of four rows corresponds to a single block column of H-matrix 200. The particular rows output are determined by addresses supplied by LDPC decoder AM, which provides the row identifiers to soft-value memories 712(1)-(12). To further understand the operation of de-interleaver 700, consider FIG. 8.

Figure 8:
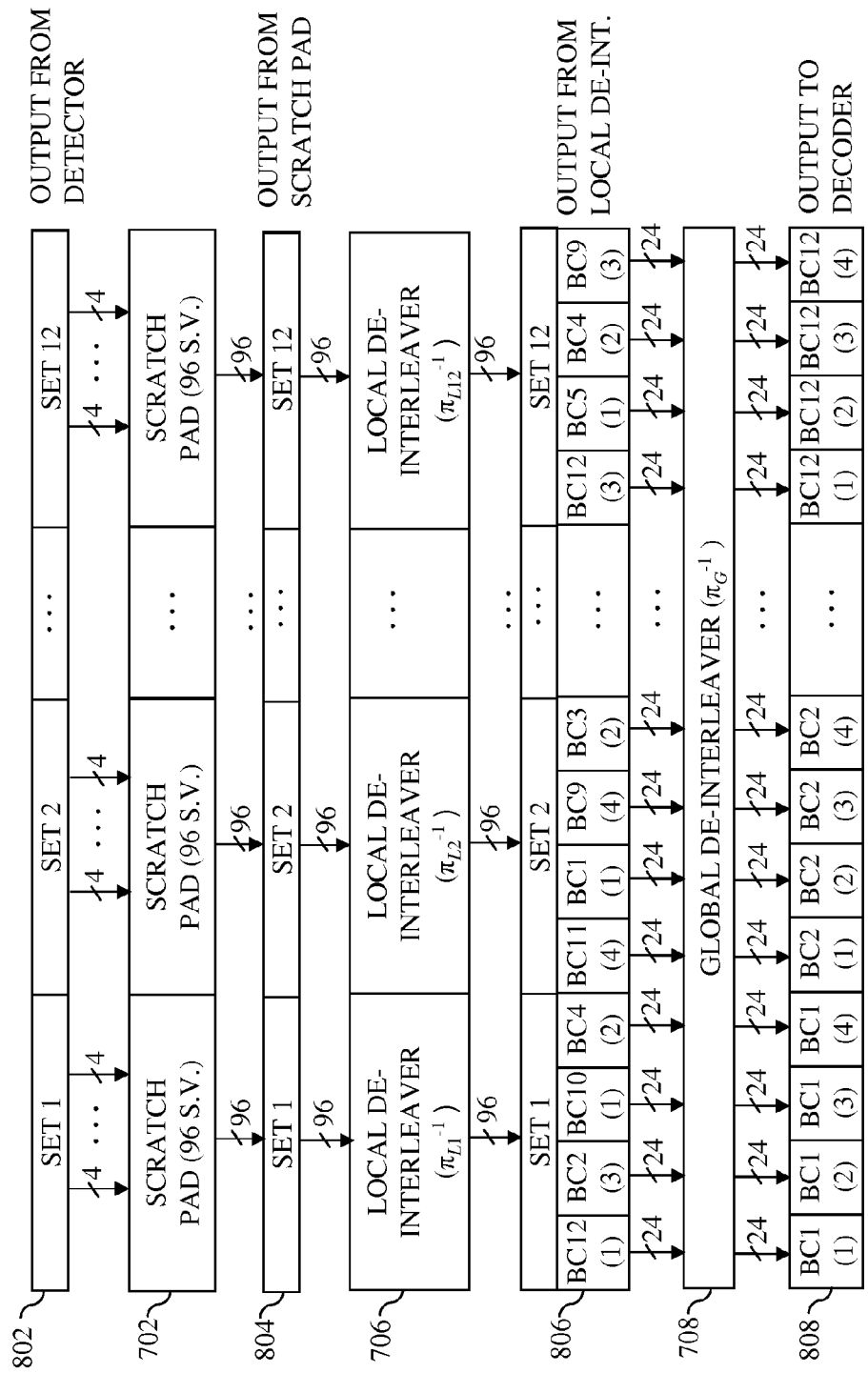
FIG. 8 shows a data flow diagram for an exemplary de-interleaving operation performed by the de-interleaver of FIG. 7.

FIG. 8 shows a data flow diagram 800 for an exemplary de-interleaving operation performed by de-interleaver 700. In data flow diagram 800, upper row 802 corresponds to the sets of 96 channel soft-output values $La_n^{(0)}$ received from the detector. The sets of channel soft-output values $La_n^{(0)}$ are received from left to right by de-interleaver 500, and the channel soft-output values $La_n^{(0)}$ in each set are received at a rate of four channel soft-output values $La_n^{(0)}$ per clock cycle. Scratch pad 502 accumulates a set of 96 channel soft-output values $La_n^{(0)}$ every 24 clock cycles during the write operation. Each set of 96 channel soft-output values $La_n^{(0)}$ has four subsets, each subset having 24 channel soft-output values $La_n^{(0)}$ that correspond to a different block column of H-matrix 200. The individual channel soft-output values $La_n^{(0)}$ of the four subsets are interleaved with one another such that 24 channel soft-output values $La_n^{(0)}$ of each subset are spread across the 96 channel soft-output values $La_n^{(0)}$ of the set. After accumulating a set of 96 channel soft-output values $La_n^{(0)}$, scratch pad 702 outputs the 96 channel soft-output values $La_n^{(0)}$ as shown in row 804 in parallel to local de-interleaver 706. Local de-interleaver 506 performs local de-interleaving to re-arrange the 96 channel soft-output values $La_n^{(0)}$ such that the 24 channel soft-output values $La_n^{(0)}$ in each subset are grouped together in order (e.g., numerical order). To further understand how the subsets are arranged, consider FIG. 9.

FIG. 9 shows Table I, which illustrates an example of how the 1,152 channel soft-output values $La_n^{(0)}$ may be divided into subsets and stored in soft-value memories 712(1)-(12). As shown, the 96 channel soft-output values $La_n^{(0)}$ corresponding to each block column (BC) are divided into four subsets, each subset having 24 channel soft-output values $La_n^{(0)}$. For example, the 96 channel soft-output values $La_n^{(0)}$ corresponding to the first block column (BC1) of H-matrix 200 are divided into subsets BC1(1), BC1(2), BC1(3), and BC1(4). Subset BC1(1) has channel soft-output values $La_1^{(0)}$ to $La_{24}^{(0)}$ corresponding to individual columns 1-24 of H-matrix 200, subset BC1(2) has channel soft-output values $La_{25}^{(0)}$ to $La_{48}^{(0)}$ corresponding to individual columns 25-28, subset BC1(3) has channel soft-output values $La_{49}^{(0)}$ to $La_{72}^{(0)}$ corresponding to individual columns 49-72, and subset BC1(4) has channel soft-output values $La_{73}^{(0)}$ to $La_{96}^{(0)}$ corresponding to individual columns 73-96.

Referring back to FIG. 8, in this example, the first set (set 1) of channel soft-output values $La_n^{(0)}$ includes (i) the first subset of the twelfth block column (BC12(1)), (ii) the third subset of the second block column (BC2(3)), (iii) the first subset of the tenth block column (BC10(1)), and (iv) the second subset of the fourth block column (BC4(2)). Before local de-interleaving, the individual channel soft-output values $La_n^{(0)}$ of subsets BC12(1), BC2(3), BC10(1), and BC4(2) are interleaved with one another. After local de-interleaving, the individual channel soft-output values $La_n^{(0)}$ of subset BC12(1) are grouped together, the individual channel soft-output values $La_n^{(0)}$ of subset BC2(3) are grouped together, the individual channel soft-output values $La_n^{(0)}$ of subset BC10(1) are grouped together, and the individual channel soft-output values $La_n^{(0)}$ of subset BC4(2) are grouped together as shown in row 806. In addition, the individual channel soft-output values $La_n^{(0)}$ of each subset are arranged in numerical order. For example, referring to Table I of FIG. 9, the channel soft-output values $La_n^{(0)}$ corresponding to subset BC12(1) are arranged in numerical order from $La_{1057}^{(0)}$ to $La_{1080}^{(0)}$, and the channel soft-output values $La_n^{(0)}$ corresponding to subset BC2(3) are arranged in numerical order from $La_{145}^{(0)}$ to $La_{168}^{(0)}$.

After de-interleaving each set of 96 channel soft-output values $La_n^{(0)}$, the four corresponding subsets of 24 channel soft-output values $La_n^{(0)}$ are output as shown in row 806 to global de-interleaver 708. Upon receiving four subsets of 24 channel soft-output values $La_n^{(0)}$, the four subsets are stored in the appropriate addresses of soft-value memories 712(1)-(12) of global de-interleaver 708. In this example, as shown in FIG. 9, the subsets of channel soft-output values $La_n^{(0)}$ corresponding to the first block column (i.e., BC1(1), BC1(2), BC1(3), BC1(4)) are stored in the first rows of soft-value memories 712(1)-(4), respectively, the subsets of channel soft-output values $La_n^{(0)}$ corresponding to the second block column (i.e., BC2(1), BC2(2), BC2(3), BC2(4)) are stored in the first rows of soft-value memories 712(5)-(8), respectively, and the subsets of channel soft-output values $La_n^{(0)}$ corresponding to the third block column (i.e., BC3(1), BC3(2), BC3(3), BC3(4)) are stored in the first rows of soft-value memories 712(9)-(12), respectively. This pattern is repeated for the remaining subsets beginning with the subsets corresponding to the fourth block column (i.e., BC4(1), BC4(2), BC4(3), BC4(4)), which are stored in the second rows of soft-value memories 712(1)-(4), respectively.

After all 1,152 channel soft-output values $La_n^{(0)}$ have been received, the channel soft-output values $La_n^{(0)}$ are output, as represented in bottom row 808, from global de-interleaver 708 to the decoder. Four subsets of 24 channel soft-output values $La_n^{(0)}$ are output at a time. Thus, subsets BC1(1), BC1(2), BC1(3), and BC1(4) corresponding to the first block column are provided concurrently from the first rows of soft-value memories 712(1)-(4), followed by subsets BC2(1), BC2(2), BC2(3), and BC2(4) corresponding to the second block column, which are output concurrently from the first rows of soft-value memories 712(5)-(8), and so on. As discussed above, the four output ports of global de-interleaver 708 provide access to four rows of four different soft-value memories 712 at a time. Thus, in order to output all four subsets corresponding to one block column at a time, the four corresponding subsets are stored in different soft-value memories 712 of global de-interleaver 708 before being output to the decoder.

Similar to de-interleaver 500, local/global de-interleaver 700 has local de-interleaver 706, which performs de-interleaving on sets of 96 interleaved channel soft-output values $La_n^{(0)}$ on a local unit basis of one value. However, unlike de-interleaver 500, which performs global de-interleaving on a global unit basis that is equal to the local set size (i.e., 96 values), global de-interleaver 708 performs global de-interleaving on a global unit basis that is smaller than the local set size. In particular, global de-interleaver 708 de-interleaves 48 global units on a global unit basis of 24 values, where each global unit has 24 de-interleaved channel soft-output values $La_n^{(0)}$.

Another way of describing the difference between local/global de-interleaver 500 and local/global de-interleaver 700 is that, in local/global de-interleaver 500, local de-interleaver 506 generates one global unit for each set of 96 values operated on by local de-interleaver 506, where each global unit also has 96 values, while, in local/global de-interleaver 700, local de-interleaver 706 generates multiple (i.e., four) global units for each set of 96 values operated on by local de-interleaver 706, where each global unit has only 24 values. In other words, in local/global de-interleaver 500, the global unit basis (i.e., 96 values) is equal to the local set size (i.e., 96 values), while, in local/global de-interleaver 700, the global unit basis (i.e., 24 values) is smaller than the local set size (i.e., 96 values).

Compared to de-interleaver 300, de-interleaver 700 is capable of performing a de-interleaving operation in a fewer number of clock cycles. In addition, de-interleaver 700 is less complex than an interleaver comparable to de-interleaver 300 that processes more than one channel soft-output value $La_n^{(0)}$ per clock cycle (i.e., that has more than one input port). Further, the processing performed by de-interleaver 700 is not as limited as the processing performed by de-interleaver 500 because the 96 channel soft-output values $La_n^{(0)}$ corresponding to each block column of H-matrix 200 are not processed together as a set, and therefore the 96 channel soft-output values $La_n^{(0)}$ can be spread out amongst the other sets.

One additional attribute of de-interleaver 700 is that de-interleaver 700 can start processing channel soft-output values $La_n^{(0)}$ as soon as they are received from the detector. Thus, de-interleaver 700 can process all but the last four received channel soft-output values $La_n^{(0)}$ in parallel with the detector generating other channel soft-output values $La_n^{(0)}$. After scratch pad memory 702 receives the last four channel soft-output values $La_n^{(0)}$ from the detector, scratch pad memory 702 provides the last set of 96 channel soft-output values $La_n^{(0)}$ to local de-interleaver 706 during one clock cycle. Local de-interleaving is performed on the last set, and the four de-interleaved subsets of the last set are provided to soft-value memories 712 in one clock cycle. Then all 1,152 channel soft-output values $La_n^{(0)}$ are read out of soft-value memories 712. Thus, de-interleaver 700 adds only a latency of few clock cycles to the processing performed by the detector. Thus, for each codeword, de-interleaver 700 finishes its operations at approximately the same time that the detector finishes its operations.

Figure 10:
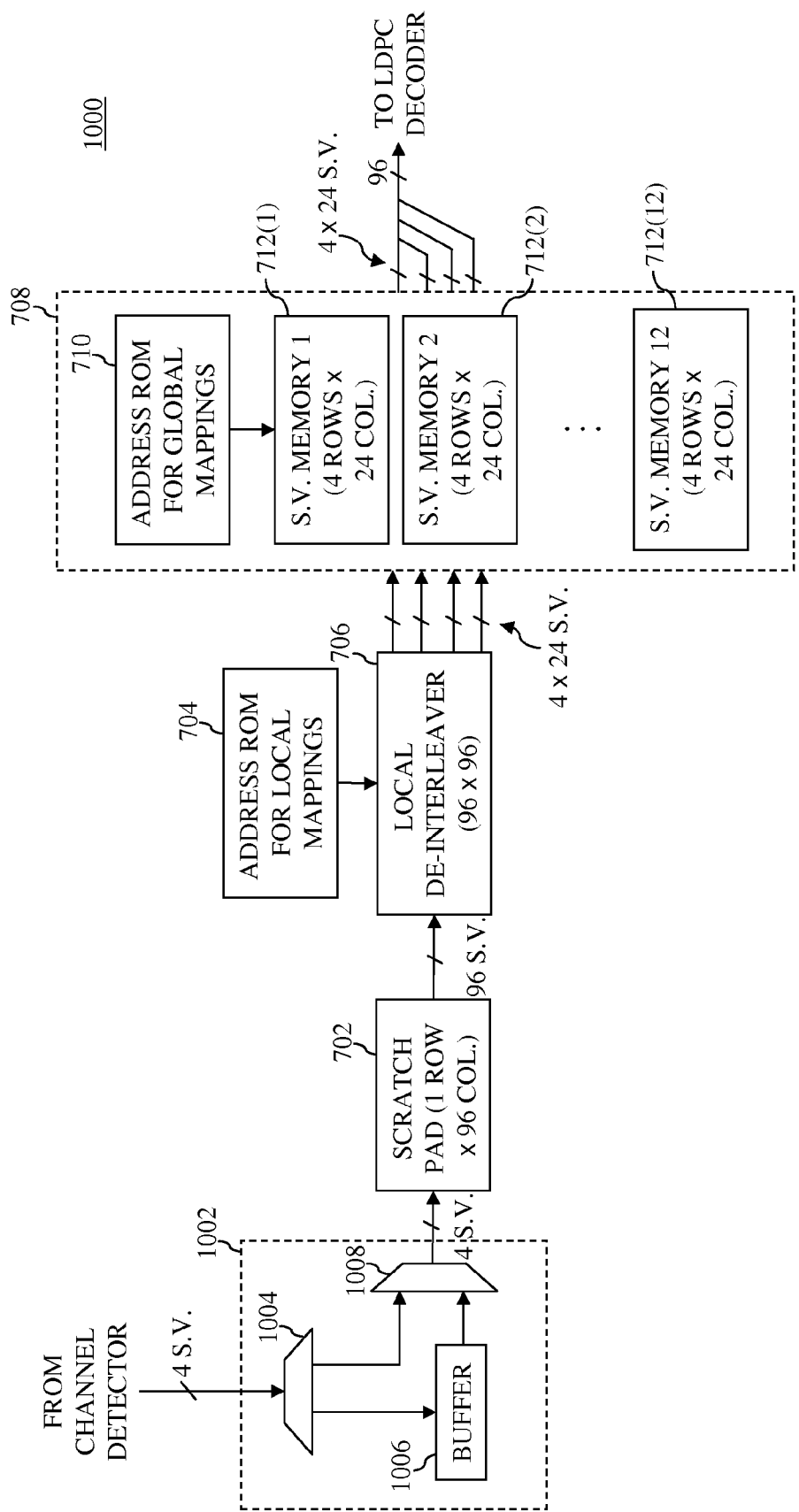
FIG. 10 shows a simplified block diagram of a de-interleaver according to another embodiment of the present invention that may be used to implement the de-interleaver in FIG. 1.

FIG. 10 shows a simplified block diagram of a local/global de-interleaver 1000 according to another embodiment of the present invention that may be used to implement de-interleaver 118 in FIG. 1. Local/global de-interleaver 1000 has codeword partitioning circuitry 1002, which divides each received codeword in half. De-multiplexer 1004 of partitioning circuitry 1002 receives the 1,152 channel soft-output values $La_n^{(0)}$ corresponding to each codeword at a rate of four channel soft-output values $La_n^{(0)}$ per clock cycle and divides the 1,152 channel soft-output values $La_n^{(0)}$ in half. The first 576 channel soft-output values $La_n^{(0)}$ received are provided to buffer 1006, and the second 576 channel soft-output values $La_n^{(0)}$ received are provided to the upper input of multiplexer 1008. Buffer 1006 stores the first 576 received channel soft-output values $La_n^{(0)}$ and provides them to the lower input of multiplexer 1008.

Multiplexer 1008 outputs chunks of p/2 (e.g., 96/2=48) channel soft-output values $La_n^{(0)}$ from the upper and lower inputs in alternating fashion. For example, a chunk of 48 channel soft-output values $La_n^{(0)}$ is output from the lower input at a rate of four channel soft-output values $La_n^{(0)}$ per clock cycle, followed by a chunk of 48 channel soft-output values $La_n^{(0)}$ from the upper input at a rate of four channel soft-output values $La_n^{(0)}$ per clock cycle, followed by another chunk of 48 channel soft-output values $La_n^{(0)}$ from the lower input at a rate of four channel soft-output values $La_n^{(0)}$ per clock cycle, and so on. Each pair of alternating chunks forms one set of 96 channel soft-output values $La_n^{(0)}$. The sets of 96 channel soft-output values $La_n^{(0)}$ are then processed by scratch pad memory 702, address ROM 704, local de-interleaver 706, and global de-interleaver 708 as described above in relation to FIG. 7.

Figure 11:
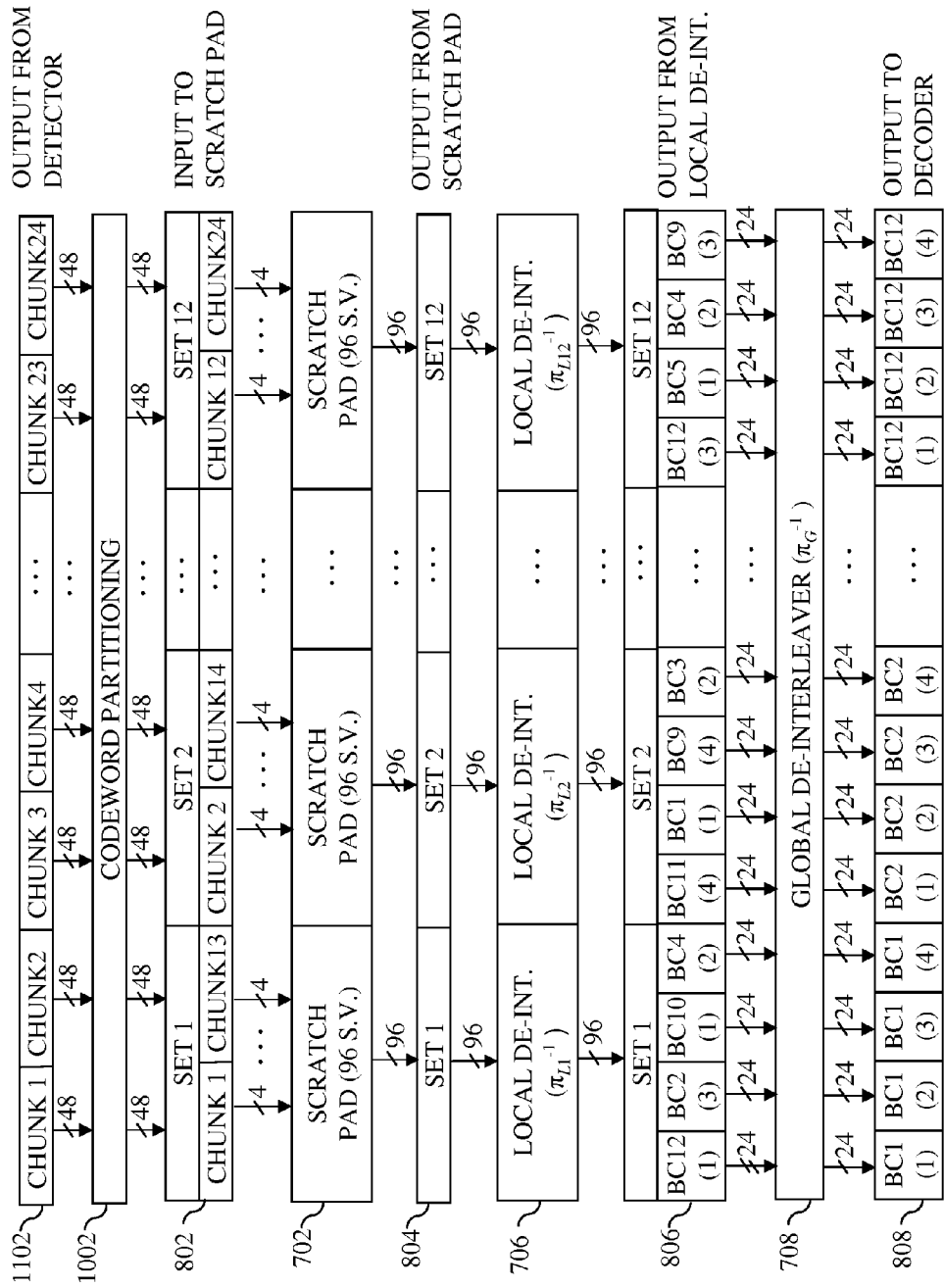
FIG. 11 shows a data flow diagram for an exemplary de-interleaving operation performed by the de-interleaver of FIG. 10.

FIG. 11 shows a data flow diagram 1100 for an exemplary de-interleaving operation performed by de-interleaver 1000. In data flow diagram 1100, upper row 1102 corresponds to the 24 chunks of 48 channel soft-output values $La_n^{(0)}$ received from the detector. The chunks are received in numerical order from chunk 1 to chunk 24 by codeword partitioning circuitry 1002. Codeword partitioning circuitry 1002 then alternates chunks from the first half of the received interleaved codeword with chunks from the second half of the received interleaved codeword. Thus, chunks 1 and 13 form the first set of 96 channel soft-output values $La_n^{(0)}$, chunks 2 and 14 form the second set of 96 channel soft-output values $La_n^{(0)}$, and so on. The sets of channel soft-output values $La_n^{(0)}$ are then processed as described above in relation to FIG. 8. Partitioning each codeword in such a manner further spreads the individual channel soft-output values $La_n^{(0)}$ across all 1,152 channel soft-output values $La_n^{(0)}$.

Figure 12:
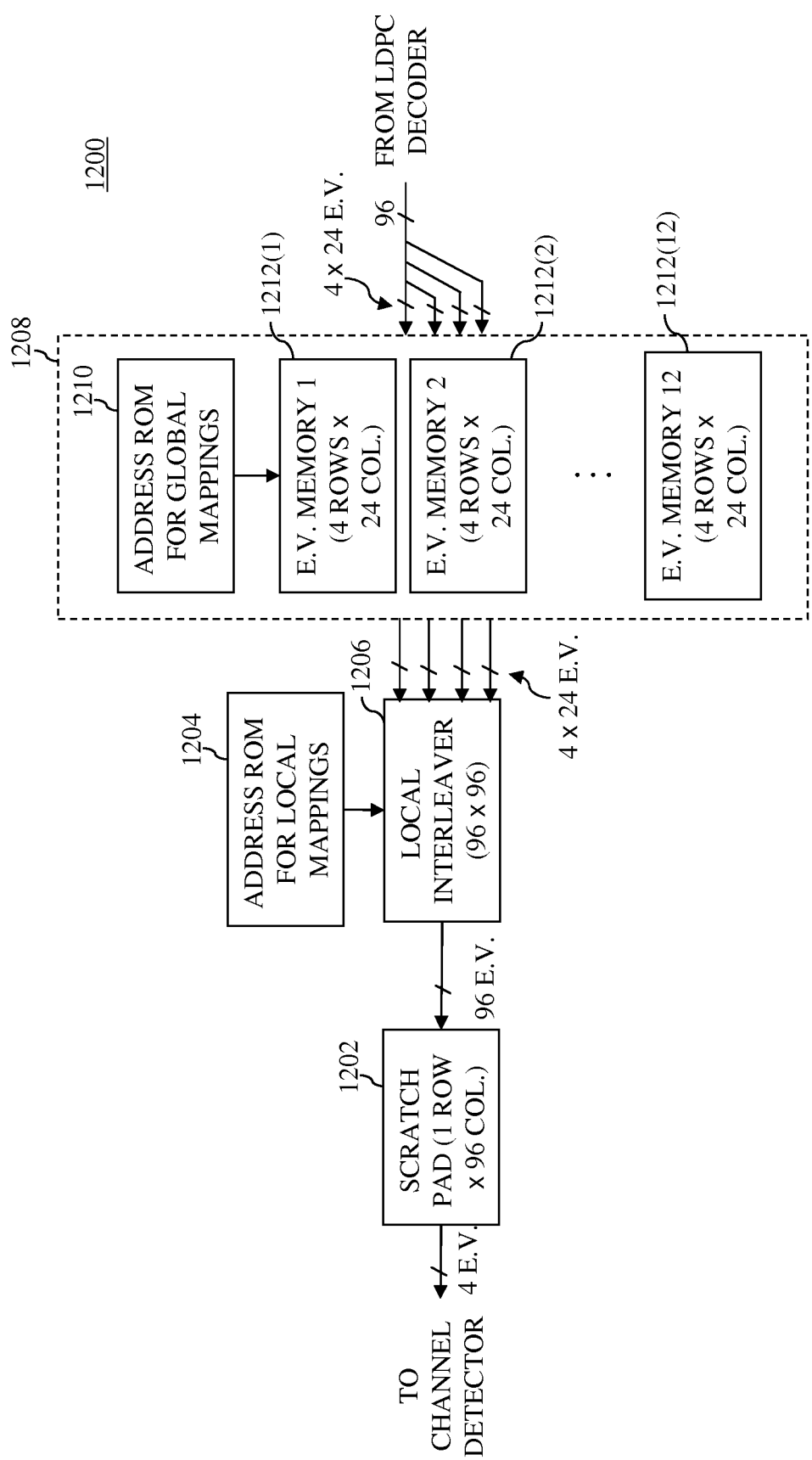
FIG. 12 shows a simplified block diagram of an interleaver according to one embodiment of the present invention that may be used to implement each interleaver in FIG. 1.

The processing of each of de-interleavers 300, 500, 700, and 1000 may be reversed to implement interleavers 110 and 120. As an example, consider FIG. 12, which shows a simplified block diagram of a local/global interleaver 1200 according to one embodiment of the present invention that may be used to implement each of interleaver 110 and interleaver 120 in FIG. 1. Interleaver 1200 implements processing that is the inverse of de-interleaver 700 (e.g., the reverse of FIG. 8). Global interleaver 1208 has twelve memory banks 1212(1)-(12) and an address ROM 1210, which are similar to the equivalent elements of global interleaver 708.

Note that, when used to implement interleaver 110, interleaver 1200 receives bits of the encoded codeword, rather than soft-output values. Accordingly, the components of interleaver 1200 (e.g., memory banks 1212(1)-(12), local interleaver 1206, scratch pad 1202) should be sized to process bits rather than soft-output values. When used to implement interleaver 120, interleaver 1200 receives extrinsic soft-output values $Le_n$. Accordingly, the components of interleaver 1200 should be sized to process soft-output values. For ease of discussion, assume that interleaver 1200 is used to implement intereleaver 120.

Global interleaver 1208 receives four subsets of 24 extrinsic soft-output values $Le_n$, all corresponding to the same block column of H-matrix 200 from the decoder per clock cycle as illustrated in row 808 of FIG. 8. Each group of four subsets received are written to four different rows of extrinsic value (E.V.) memories 1212(1) to 1212(12) based on row identifiers provided by address ROM 1210. Similar to the example provided in Table I of FIG. 9, subsets BC1(1), BC1(2), BC1(3), and BC1(4) are written to the first rows of extrinsic value memories 1212(1), 1212(2), 1212(3), and 1212(4), respectively, subsets BC2(1), BC2(2), BC2(3), and BC2(4) are written to the first rows of extrinsic value memories 1212(5), 1212(6), 1212(7), and 1212(8), respectively, and so on.

After all 1,152 extrinsic soft-output values $Le_n$ are written to extrinsic value memories 1212(1)-(12), the extrinsic value memories 1212(1)-(12) are read out at a rate of four subsets per clock cycle. The subsets are read out based on row identifiers provided by address ROM 1210, which spreads the subsets out so that they are interleaved as shown in row 806 of FIG. 8. Each group of four subsets (i.e., a set of 96 extrinsic soft-output values $Le_n$) are provided to local interleaver 1206, which implements local interleaving mappings $\pi_{Lc}$ to interleave the individual extrinsic soft-output values $Le_n$ in each set amongst one another. The particular local interleaving mappings $\pi_{Lc}$ implemented by local interleaver 1206 may vary from one set to the next. The 96 extrinsic soft-output values $Le_n$ of each set are (i) provided in parallel to scratch pad memory during one clock cycle and (ii) read out from scratch pad memory 1202 to the channel detector at a rate of four extrinsic soft-output values $Le_n$ per clock cycle.

Although the present invention was described relative to the specific H-matrix 200 of FIG. 2, the present invention is not so limited. The present invention may be implemented for various H-matrices that are suitable for message-passing decoding and that are the same size as or a different size from matrix 200 of FIG. 2. For example, the present invention may be implemented for H-matrices in which the number of columns, block columns, rows, block rows, layers (including implementations having only one layer), messages processed per clock cycle, the size of the sub-matrices, the size of the layers, and/or the column and/or row hamming weights differ from that of H-matrix 200. Such H-matrices may be, for example, cyclic, quasi-cyclic, non-cyclic, regular, or irregular H-matrices. H-matrices that are non-cyclic do not have any sub-matrices that are obtained by cyclically shifting an identity matrix. H-matrices that are irregular do not have the same hamming weight $w_r$ for all rows and/or the same hamming weight $w_c$ for all columns. Further, such H-matrices may comprise sub-matrices other than circulants including zero matrices.

It will be further understood that various changes in the details, materials, and arrangements of the parts which have been described and illustrated in order to explain the nature of this invention may be made by those skilled in the art without departing from the scope of the invention as expressed in the following claims. For example, the number of channel soft-output values $La_n^{(O)}$ provided to de-interleavers 700 and 1000 from the channel detector(s) may be greater than or less than four channel soft-output values $La_n^{(O)}$ per clock cycle depending on how the channel detector(s) are implemented. As another example, the number of input and output ports of global de-interleaver 708 may be greater than or less than four, and the number of channel soft-output values $La_n^{(O)}$ accessed per input and output port may be greater than or less than 24. As yet another example, the number of soft-value memories 712 and the size of soft-value memories 712 may vary from one embodiment to the next. As even yet another example, scratch pad 702 and local de-interleaver 706 could be sized to process a number of channel soft-output values $La_n^{(O)}$ other than p. For instance, scratch pad memory 702 and local de-interleaver 706 could process 2p, where each set of p channel soft-output values $La_n^{(O)}$ corresponds to a different block column of H-matrix 200, or p/2 channel soft-output values $La_n^{(O)}$ corresponding to half of one block column of H-matrix 200. The number of input ports, output ports, the size of soft-value memories 712, and the number of soft-values memories 712 may be changed to accommodate the change in the number of channel soft-output values $La_n^{(O)}$ processed by scratch pad memory 702 and local de-interleaver 706.

Although interleavers and de-interleavers of the present invention were described relative to their use with a specific communications system (i.e., 100), the present invention is not so limited. Interleavers and de-interleavers of the present invention may be used with communications systems other than system 100. Such other systems may process more than one codeword, and accordingly may have more than one LDPC encoder, LDPC decoder, and channel detector.

Rather than implementing codeword partitioning circuitry 1002 in FIG. 10, various embodiments of the present invention may implement multiple channel detectors that concurrently provide channel soft-output values to scratch pad memory 702. For example, a first channel detector may provide the first 576 channel soft-output values $La_n^{(O)}$ to the upper input of multiplexer 1008, and a second channel detector may concurrently provide the second 576 channel soft-output values $La_n^{(O)}$ to the lower input of multiplexer 1008. The upper and lower inputs may then be multiplexed as described above in relation to FIG. 10. Such an implementation would exhibit a shorter latency period than de-interleaver 1000 because 576 channel soft-output values $La_n^{(O)}$ would not need to be buffered by buffer 1006.

Various embodiments of the present invention may be implemented using a local unit basis and/or a global unit basis other than those discussed above in relation to FIG. 7. For example, embodiments of the present invention may be envisioned in which the local de-interleaver performs de-interleaving on sets of channel soft-output values $La_n^{(O)}$ on a local unit basis of two values (e.g., 48 two-value local units are de-interleaved local unit by local unit). Further, various embodiments may be envisioned in which the global de-interleaver performs global de-interleaving on a global unit basis of twelve values (e.g., 96 twelve-value global units are de-interleaved global unit by global unit). In that case, for each set of 96 values, the local de-interleaver would generate 8 twelve-value global units for the global interleaver.

Although the present invention was described as processing sets of values, where the values correspond to both parity bits and data bits of an LDPC-encoded codeword, the present invention is not so limited. Local/global interleavers and de-interleavers of the present invention may be implemented separately for values corresponding to parity bits and values corresponding to data bits. For example, in FIG. 1, rather than having one local/global interleaver 110 positioned at the output of multiplexer 108, system 100 could have two local/global interleavers, where one is positioned to perform interleaving on the parity bits before they are provided to the upper input of multiplexer 108, and the other is positioned to perform interleaving on the data bits before they are provided to the lower input of multiplexer 108. In such embodiments various parameters of the local/global interleavers may change. For example, the global interleaver memory for the data bits may be sized to store 8×96=768 data values as opposed to the full 1,152 data values in a codeword, and the global interleaver memory for the parity bits may be sized to store 4×96=384 parity values as opposed to the full 1,152 data values in a codeword.

Corresponding changes may be made in the read path of system 100 to (i) de-multiplex the parity channel soft-output values from the data channel soft-output values and then (ii) de-interleave the parity channel soft-output values and the data channel soft-output values separately. Further, corresponding changes may be made to (i) de-multiplex the parity extrinsic soft-output values from the data extrinsic soft-output values and then (ii) interleave the parity extrinsic soft-output values and the data extrinsic soft-output values separately.

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. The present invention can also be embodied in the form of program code, for example, stored in a non-transitory machine-readable storage medium including being loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

The present invention can also be embodied in the form of a bitstream or other sequence of signal values stored in a non-transitory recording medium generated using a method and/or an apparatus of the present invention.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An apparatus configured to perform interleaving on values in an information word to generate an interleaved information word, the apparatus comprising:
   a global interleaver configured to interleave, on a global unit basis, the values in the information word to generate a plurality of interleaved global units, each global unit having multiple values corresponding to the information word; and
   a local interleaver configured to:
      receive a first group of multiple global units from the global interleaver;
      interleave, on a local unit basis, lower than the global unit basis, the first group of multiple global units to generate a first set of interleaved values of the interleaved information word;
      receive a second group of multiple global units from the global interleaver; and
      interleave, on the local unit basis, the second group of multiple global units to generate a second set of interleaved values of the interleaved information word.

2. The invention of claim 1, wherein:
   the information word corresponds to a low-density parity-check-encoded codeword that is generated based on a parity-check matrix;
   the multiple global units in the first group of multiple global units correspond to a first block column of the parity-check matrix; and
   the multiple global units in the second group of multiple global units correspond to a second block column of the parity-check matrix, different from the first block column.

3. The invention of claim 2, wherein:
   a number of values in the first group of multiple global units is equal to a number of individual columns in the first block column; and
   a number of values in the second group of multiple global units is equal to a number of individual columns in the second block column.

4. The invention of claim 2, wherein a number of values in the first set of interleaved values is equal to a number of individual columns in a block column of the parity-check matrix.

5. The invention of claim 1, wherein the apparatus comprises:
   a low-density parity-check decoder configured to perform low-density parity-check decoding to generate a set of extrinsic values, each extrinsic value corresponding to a bit of a low-density parity-check-encoded codeword, wherein the extrinsic values are the values in the information word; and a channel detector that performs detection based on the extrinsic values received from the local interleaver.

6. The invention of claim 1, wherein the apparatus comprises a low-density parity-check encoder that performs low-density parity-check encoding to generate bits of a low-density parity-check-encoded codeword, wherein the low-density parity-check-encoded codeword is the information word and the bits of the low-density parity-check-encoded codeword are the values in the information word.

7. The invention of claim 1, wherein the local interleaver is configured to:
   interleave the first group of multiple global units based on a first interleaving mapping to generate the first set of interleaved values; and
   interleave the second group of multiple global units based on a second interleaving mapping, different from the first interleaving mapping, to generate the second set of interleaved values.

8. The invention of claim 1, wherein:
   the information word corresponds to a low-density parity-check-encoded codeword encoded based on a parity-check matrix; and
   a number of values in the information word is equal to a number of bits in the low-density parity-check-encoded codeword.

9. The invention of claim 8, wherein:
   the local unit basis is one value;
   each of the first and second sets of interleaved values of the interleaved information word has a number of values equal to a number of values in a block column of the parity-check matrix; and
   each of the first and second groups of multiple global units has a number of global units that is greater than one; and
   the global unit basis is obtained by dividing the number of values in the first set of interleaved values of the interleaved information word by the number of global units.

10. A local and global interleaver-implemented method for performing interleaving on values in an information word to generate an interleaved information word, the method comprising:
   (a) interleaving on a global unit basis, the values in the information word to generate a plurality of interleaved global units, each global unit having multiple values corresponding to the information word;
   (b) receiving a first group of multiple global units from the global interleaver;
   (c) interleaving on a local unit basis, lower than the global unit basis, the first group of multiple global units to generate a first set of interleaved values of the interleaved information word;
   (d) receiving a second group of multiple global units from the global interleaver; and
   (e) interleaving on the local unit basis, the second group of multiple global units to generate a second set of interleaved values of the interleaved information word.

11. An apparatus configured to perform de-interleaving on values in an information word to generate a de-interleaved information word, the apparatus comprising:
   a local de-interleaver configured to:
      receive a first set of multiple values corresponding to the information word;
      de-interleave, on a local unit basis, the first set of multiple values to generate a first group of two or more global units, each global unit in the first group of two or more global units having multiple values corresponding to the information word;
      receive a second set of multiple values corresponding to the information word; and
      de-interleave, on the local unit basis, the second set of multiple values to generate a second group of two or more global units, each global unit in the second group of two or more global units having multiple values corresponding to the information word; and
   a global de-interleaver configured to:
      receive at least the first and second groups of two or more global units from the local de-interleaver; and
      de-interleave, on a global unit basis, greater than the local unit basis, at least the global units of the first and second groups of two or more global units to generate the de-interleaved information word.

12. The invention of claim 11, wherein:
   the information word corresponds to a low-density parity-check-encoded codeword that is generated based on a parity-check matrix;
   a global unit in the first group of two or more global units corresponds to a first block column of the parity-check matrix;
   a global unit in the second group of two or more global units corresponds to the first block column of the parity-check matrix; and
   the de-interleaved information word comprises a third group having (i) the global unit in the first group corresponding to the first block column and (ii) the global unit in the second group corresponding to the first block column.

13. The invention of claim 12, wherein a global unit in the first group of two or more global units corresponds to a second block column of the parity-check matrix, different from the first block column.

14. The invention of claim 12, wherein a number of values in the third group is equal to a number of individual columns in the first block column.

15. The invention of claim 11, wherein a number of values in each of the first and second sets of multiple values is equal to a number of individual columns in a block column of the parity-check matrix.

16. The invention of claim 11, wherein the apparatus comprises:
   a channel detector configured to perform detection to generate the values of the information word, wherein each of the values of the information word corresponds to a bit of a low-density parity-check-encoded codeword; and
   a low-density parity-check decoder configured to (i) receive the de-interleaved information word from the global de-interleaver and (ii) perform low-density parity-check decoding on the de-interleaved information word to recover the low-density parity-check-encoded codeword.

17. The invention of claim 11, wherein the local de-interleaver is configured to:
   use a first de-interleaving mapping to de-interleave the first set; and
   use a second de-interleaving mapping, different from the first de-interleaving mapping, to de-interleave the second set.

18. The invention of claim 11, wherein:
   the information word corresponds to a low-density parity-check-encoded codeword encoded based on a parity-check matrix; and
   a number of values in the information word is equal to a number of bits in the low-density parity-check-encoded codeword.

19. The invention of claim 18, wherein:
the local unit basis is one value;
each of the first and second sets of multiple values has a number of values equal to a number of values in a block column of the parity-check matrix;
each of the first and second groups of two or more global units has a number of global units greater than one; and
the global unit basis is obtained by dividing the number of values in the first set by the number of global units.

20. A local and global de-interleaver-implemented method for performing de-interleaving on values in an information word to generate a de-interleaved information word, the method comprising:
(a) receiving, at a local de-interleaver, a first local set of multiple values corresponding to the information word;
(b) de-interleaving on a local unit basis, the first set of multiple values to generate a first group of two or more global units, each global unit in the first group of two or more global units having multiple values corresponding to the information word;
(c) receiving a second set of multiple values corresponding to the information word;
(d) de-interleaving on the local unit basis, the second set of multiple values to generate a second group of two or more global units, each global unit in the second group of two or more global units having multiple values corresponding to the information word;
(e) receiving at least the first and second groups of two or more global units from the local de-interleaver; and
(f) de-interleaving on a global unit basis, greater than the local unit basis, at least the global units of the first and second groups of two or more global units to generate the de-interleaved information word.

* * * * *